US012537168B2

(12) United States Patent
Nagami et al.

(10) Patent No.: US 12,537,168 B2
(45) Date of Patent: Jan. 27, 2026

(54) PLASMA PROCESSING METHOD AND PLASMA PROCESSING APPARATUS

(71) Applicant: TOKYO ELECTRON LIMITED, Tokyo (JP)

(72) Inventors: Koichi Nagami, Miyagi (JP); Tatsuro Ohshita, Miyagi (JP); Kazuya Nagaseki, Miyagi (JP); Shinji Himori, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/396,109

(22) Filed: Apr. 26, 2019

(65) Prior Publication Data

US 2019/0333741 A1 Oct. 31, 2019

(30) Foreign Application Priority Data

Apr. 27, 2018 (JP) ................................ 2018-087283

(51) Int. Cl.
*H01J 37/32* (2006.01)

(52) U.S. Cl.
CPC .. *H01J 37/32422* (2013.01); *H01J 37/32091* (2013.01); *H01J 37/32715* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 8,969,211 | B2 * | 3/2015 | Muto | H01J 37/32165 438/714 |
| 10,431,433 | B2 * | 10/2019 | Nagami | H01J 37/32697 |
| 2002/0115301 | A1 | 8/2002 | Savas | |
| 2009/0194508 | A1 * | 8/2009 | Ui | H01J 37/32027 216/67 |
| 2009/0242127 | A1 * | 10/2009 | Koshimizu | H01J 37/32697 156/345.47 |
| 2011/0223750 | A1 * | 9/2011 | Hayashi | H01L 21/31116 438/513 |
| 2012/0052689 | A1 * | 3/2012 | Tokashiki | H01L 21/31116 156/345.28 |
| 2014/0231389 | A1 * | 8/2014 | Nagami | H01J 37/32706 216/67 |

(Continued)

FOREIGN PATENT DOCUMENTS

| | | | |
|---|---|---|---|
| JP | H08-045903 | A | 2/1996 |
| JP | 2004-193564 | A | 7/2004 |

(Continued)

*Primary Examiner* — Parviz Hassanzadeh
*Assistant Examiner* — Tiffany Z Nuckols
(74) *Attorney, Agent, or Firm* — XSENSUS LLP

(57) ABSTRACT

A plasma processing method includes providing a plasma processing apparatus; supplying radio-frequency waves from a radio-frequency power supply; and applying a negative DC voltage to a lower electrode from the at least one DC power supply. In the applying the DC voltage, the DC voltage is cyclically applied to the lower electrode, and in a state where a frequency defining each cycle in which the DC voltage is applied to the lower electrode is set to be lower than 1 MHz, a ratio occupied by a period during which the DC voltage is applied to the lower electrode in the each cycle is regulated.

8 Claims, 26 Drawing Sheets

(56) References Cited

U.S. PATENT DOCUMENTS

| | | | | |
|---|---|---|---|---|
| 2014/0251956 | A1* | 9/2014 | Jeon | H01J 37/32577 216/71 |
| 2014/0302682 | A1 | 10/2014 | Muto et al. | |
| 2015/0044877 | A1 | 2/2015 | Ohtake et al. | |
| 2015/0354061 | A1* | 12/2015 | Dhas | H01J 37/32091 427/570 |
| 2016/0079037 | A1* | 3/2016 | Hirano | H01J 37/32183 156/345.28 |
| 2016/0247666 | A1* | 8/2016 | Urakawa | H01J 37/32174 |
| 2017/0250056 | A1* | 8/2017 | Boswell | H02M 1/14 |
| 2018/0366305 | A1* | 12/2018 | Nagami | H01J 37/32165 |
| 2019/0057845 | A1* | 2/2019 | Nagami | H01J 37/32697 |
| 2019/0157040 | A1* | 5/2019 | Fairbairn | H01J 37/32935 |

FOREIGN PATENT DOCUMENTS

| | | | |
|---|---|---|---|
| JP | 2008-053516 | A | 3/2008 |
| JP | 2008-243568 | A | 10/2008 |
| JP | 4714166 | B2 | 6/2011 |
| JP | 2012-104382 | A | 5/2012 |
| JP | 5896572 | B2 | 3/2016 |
| KR | 10-2008-0020463 | A | 3/2008 |
| KR | 10-2012-0022251 | A | 3/2012 |
| KR | 10-2016-0033034 | A | 3/2016 |
| KR | 10-1638746 | B1 | 7/2016 |

* cited by examiner

PLASMA PROCESSING METHOD AND PLASMA PROCESSING APPARATUS

CROSS-REFERENCE TO RELATED APPLICATIONS

This application is based on and claims priority from Japanese Patent Application No. 2018-087283, filed on Apr. 27, 2018 with the Japan Patent Office, the disclosure of which is incorporated herein in its entirety by reference.

TECHNICAL FIELD

The present disclosure relates to a plasma processing method and a plasma processing apparatus.

BACKGROUND

A plasma processing apparatus has been used in the manufacturing of electronic devices. The plasma processing apparatus generally includes a chamber body, a stage, and a radio-frequency power supply. The chamber body is grounded and provides its internal space as a chamber. The stage is provided within the chamber, and is configured to support a substrate to be placed thereon. The stage includes a lower electrode. The radio-frequency power supply supplies radio-frequency waves in order to excite the gas within the chamber. In the plasma processing apparatus, the ions are accelerated by a potential difference between the potential of the lower electrode and the potential of the plasma, and the accelerated ions are radiated onto the substrate In the plasma processing apparatus, a potential difference also occurs between the chamber body and the plasma. When the potential difference between the chamber body and the plasma is large, the energy of the ions radiated onto the inner wall of the chamber body increases, and the particles are released from the chamber body. The particles released from the chamber body contaminate the substrate placed on the stage. In order to prevent the generation of such particles, in Japanese Patent Laid-open Publication No. 2008-053516, a technique using a regulation mechanism for regulating the grounding capacity of the chamber has been proposed. The regulation mechanism described in Japanese Patent Laid-open Publication No. 2008-053516 is configured to regulate an area ratio between an anode and a cathode facing the chamber, that is, an A/C ratio.

In addition, in a plasma processing apparatus, there is a technique of supplying a DC voltage to a lower electrode for bias purpose from the viewpoint of increasing the energy of ions radiated to a substrate to increase the etching rate of the substrate. For example, Japanese Patent No. 4714166 discloses a technique for cyclically applying a DC voltage having a negative polarity to the lower electrode as a DC voltage for bias. In the technique of Japanese Patent No. 4714166, it is described that the energy of ions radiated to the substrate is increased by regulating the duty ratio of the DC voltage to 50% or more in the state in which the frequency of the DC voltage is set to, for example, 1 MHz or higher. Here, the duty ratio is a ratio occupied by a period during which the DC voltage is applied to the lower electrode within each cycle in which the DC voltage is applied to the lower electrode.

SUMMARY

A plasma processing method according to an aspect of the present disclosure includes: providing a plasma processing apparatus including: a chamber body configured to provide a chamber therein; a stage installed in the chamber body and including a lower electrode, the stage being configured to support a substrate; a radio-frequency power supply configured to supply radio-frequency waves for generating plasma of a gas supplied to the chamber; and at least one DC power supply configured to generate a negative DC voltage applied to the lower electrode, supplying the radio-frequency waves from the radio-frequency power supply; and applying a negative DC voltage to the lower electrode from the at least one DC power supply. In the applying the DC voltage, the DC voltage is cyclically applied to the lower electrode, and in a state where a frequency defining each cycle in which the DC voltage is applied to the lower electrode is set to be lower than 1 MHz, a ratio occupied by a period during which the DC voltage is applied to the lower electrode in the each cycle is regulated.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
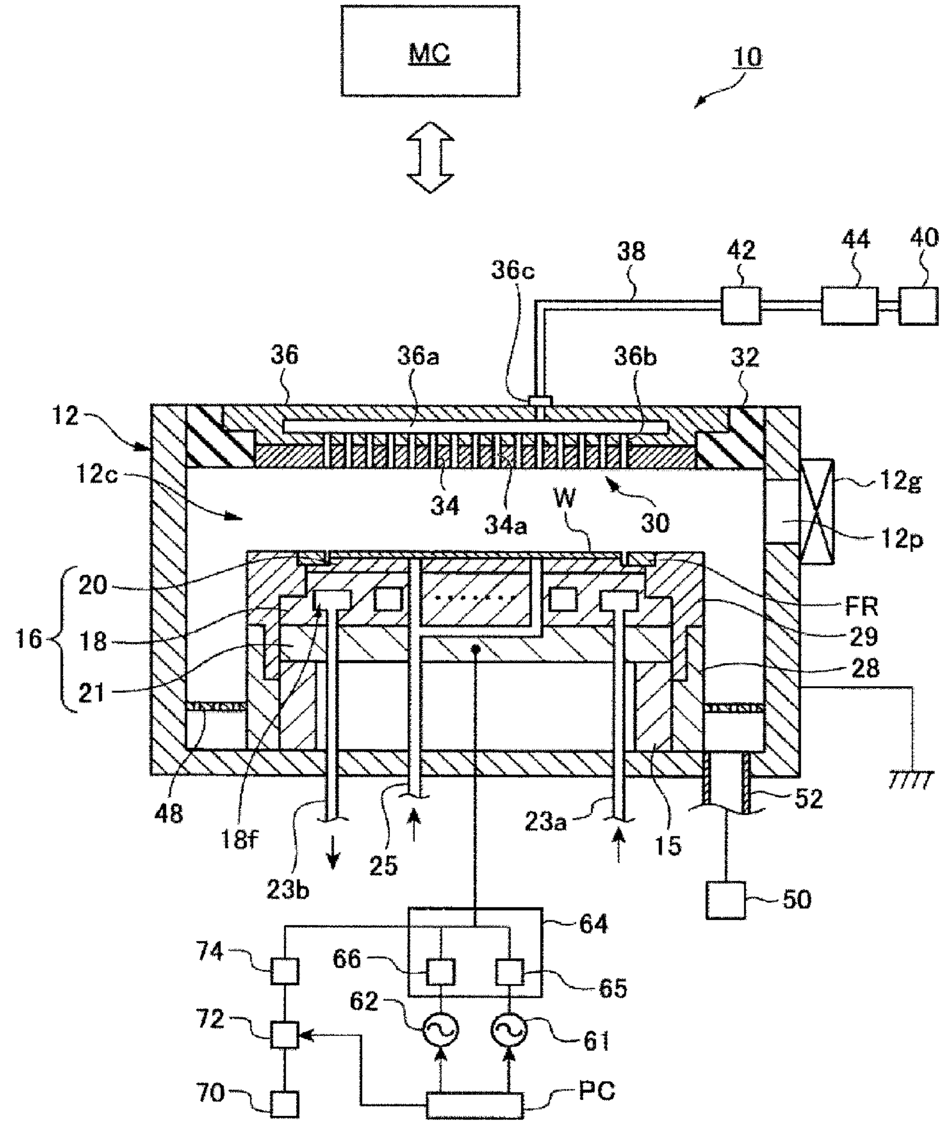
FIG. 1 is a view schematically illustrating a plasma processing apparatus according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described in detail with reference to the drawings. In each of the drawing, the same or corresponding components will be denoted by the same reference numerals.

A plasma processing apparatus has been used in the manufacturing of electronic devices. The plasma processing apparatus generally includes a chamber body, a stage, and a radio-frequency power supply. The chamber body is grounded and provides its internal space as a chamber. The stage is provided within the chamber, and is configured to support a substrate to be placed thereon. The stage includes a lower electrode. The radio-frequency power supply supplies radio-frequency waves in order to excite the gas within the chamber. In the plasma processing apparatus, the ions are accelerated by a potential difference between the potential of the lower electrode and the potential of the plasma, and the accelerated ions are radiated onto the substrate.

In the plasma processing apparatus, a potential difference also occurs between the chamber body and the plasma. When the potential difference between the chamber body and the plasma is large, the energy of ions radiated onto the inner wall of the chamber body increases, and the particles are released from the chamber body. The particles released from the chamber body contaminate a substrate placed on the stage. In order to prevent the generation of such particles, in Japanese Patent Laid-open Publication No. 2008-053516, a technique using a regulation mechanism for regulating the grounding capacity of the chamber has been proposed. The regulation mechanism described in Japanese Patent Laid-open Publication No. 2008-053516 is configured to regulate an area ratio between an anode and a cathode facing the chamber, that is, an A/C ratio.

In addition, in a plasma processing apparatus, there is a technique of supplying a DC voltage for bias to a lower electrode from the viewpoint of increasing the energy of ions radiated to a substrate to increase the etching rate of the substrate. For example, Japanese Patent No. 4714166 discloses a technique for cyclically applying a DC voltage having a negative polarity to the lower electrode as a DC voltage for bias. In the technique of Japanese Patent No. 4714166, it is described that the energy of ions radiated to the substrate is increased by regulating the duty ratio of the DC voltage to 50% or more in the state in which the frequency of the DC voltage is set to, for example, 1 MHz or higher. Here, the duty ratio is a ratio occupied by a period during which the DC voltage is applied to the lower electrode within each cycle in which the DC voltage is applied.

In a plasma processing apparatus in which a DC voltage is cyclically applied to the lower electrode, since the movement of ions in the plasma is reduced during the period in which the application of the DC voltage is stopped, the plasma potential may increase. When the potential of the plasma increases, the potential difference between the plasma and the chamber body increases, and the energy of ions radiated to the inner wall of the chamber body increases. In addition, when the frequency of the DC voltage is set to, for example, 1 MHz or higher, the energy of ions radiated to the inner wall of the chamber body tends to increase together with the energy of ions radiated to the substrate. As the energy of ions radiated to the inner wall of the chamber body increases, the number of particles released from the chamber body increases, which may accelerate the contamination of the substrate. From such a background, it is expected that the deterioration of the etching rate of the substrate is suppressed and the energy of ions radiated to the inner wall of the chamber body is lowered.

Figure 2:
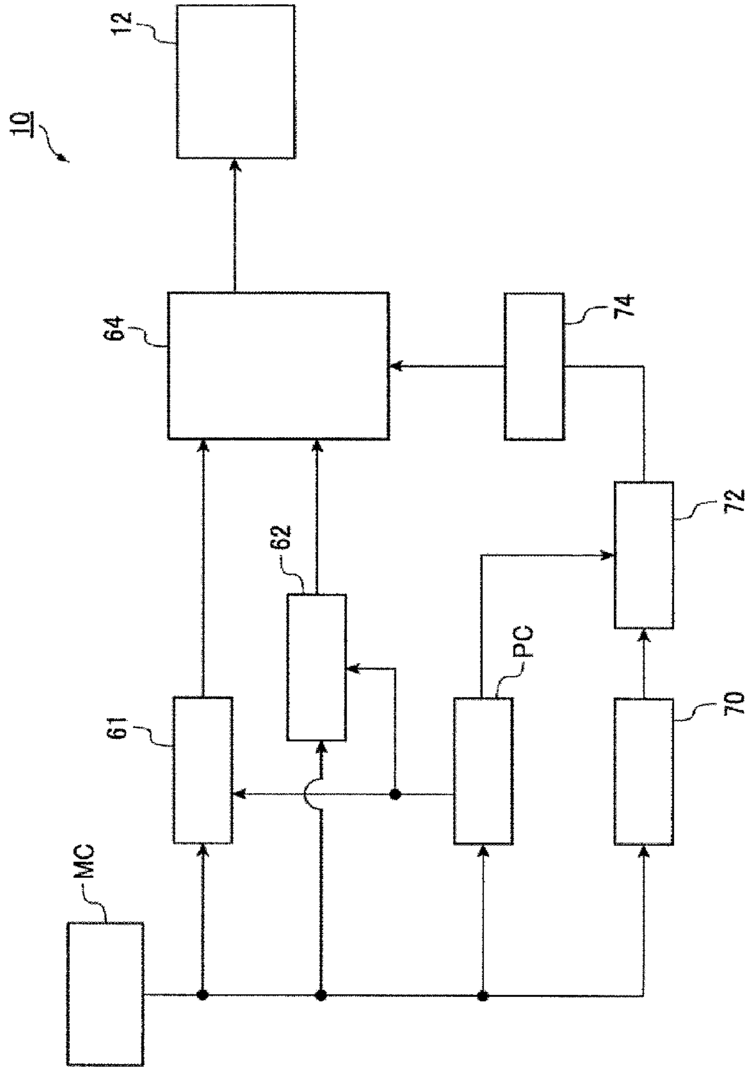
FIG. 2 is a view illustrating an embodiment of a power supply system and a control system of the plasma processing apparatus illustrated in FIG. 1.

FIG. 1 is a view schematically illustrating a plasma processing apparatus according to an embodiment. FIG. 2 is a view illustrating an embodiment of a power supply system and a control system of the plasma processing apparatus illustrated in FIG. 1. The plasma processing apparatus 10 illustrated in FIG. 1 is a capacitively coupled plasma processing apparatus.

The plasma processing apparatus 10 includes a chamber body 12. The chamber body 12 has a substantially cylindrical shape. The chamber body 12 provides the inner space thereof as a chamber 12*c*. The chamber body 12 is made of, for example, aluminum. The chamber body 12 is connected to a ground potential. A plasma-resistant film is formed on the inner wall surface of the chamber body 12, that is, the wall surface defining the chamber 12*c*. The film may be a film formed by an anodic oxidation processing or a ceramic film such as, for example, a film formed of yttrium oxide. In addition, a passage 12*p* is formed in the side wall of the chamber body 12. When the substrate W is loaded into the chamber 12*c* and when the substrate W is unloaded from the chamber 12*c*, the substrate W passes through the passage 12*p*. In order to open and close the passage 12*p*, a gate valve 12 *g* is provided along the side wall of the chamber body 12.

In the chamber 12*c*, a support unit 15 extends upward from the bottom of the chamber body 12. The support unit 15 has a substantially cylindrical shape, and is formed of an insulating material such as ceramics. A stage 16 is mounted on the support unit 15. The stage 16 is supported by the support unit 15. The stage 16 is configured to support a substrate W within the chamber 12*c*. The stage 16 includes a lower electrode 18 and an electrostatic chuck 20. In an embodiment, the stage 16 may further include an electrode plate 21. The electrode plate 21 is made of a conductive material such as, for example, aluminum, and has a substantially disk shape. The lower electrode 18 is provided on the electrode plate 21. The lower electrode 18 is made of a conductive material such as, for example, aluminum, and has a substantially disk shape. The lower electrode 18 is electrically connected to the electrode plate 21.

Within the lower electrode 18, a flow path 18*f* is provided. The flow path 18*f* is a flow path for a heat exchange medium. As the heat exchange medium, a liquid coolant or a coolant for cooling the lower electrode 18 by vaporization thereof (e.g., fluorocarbon) is used. The heat exchange medium is supplied to the flow path 18*f* from a chiller unit provided outside the chamber body 12 through a pipe 23*a*. The heat exchange medium supplied to the flow path 18*f* is returned to the chiller unit through a pipe 23*b*. That is, the heat exchange medium is supplied so as to circulate between the flow path 18*f* and the chiller unit.

The electrostatic chuck 20 is provided on the lower electrode 18. The electrostatic chuck 20 includes a main body formed of an insulator and a film-shaped electrode provided inside the main body. A DC power supply is electrically connected to the electrode of the electrostatic chuck 20. When the voltage is applied from the DC power supply to the electrode of the electrostatic chuck 20, an electrostatic attractive force is generated between the substrate W disposed on the electrostatic chuck 20 and the electrostatic chuck 20. Due to the generated electrostatic attractive force, the substrate W is attracted to the electrostatic chuck 20, and held by the electrostatic chuck 20. A focus ring FR is disposed on the peripheral edge region of the electrostatic chuck 20. The focus ring FR has a substantially annular plate shape, and is formed of, for example, silicon. The focus ring FR is disposed so as to surround the edge of the substrate W.

The plasma processing apparatus 10 is provided with a gas supply line 25. The gas supply line 25 supplies a heat transfer gas such as, for example, He gas, from the gas supply mechanism to a space between the upper surface of the electrostatic chuck 20 and the rear surface (lower surface) of the substrate W.

A cylindrical portion 28 extends upward from the bottom portion of the chamber body 12. The cylindrical portion 28 extends along the outer periphery of the support unit 15. The cylindrical portion 28 is formed of a conductive material, and has a substantially cylindrical shape. The cylindrical portion 28 is connected to a ground potential. An insulating unit 29 is provided on the cylindrical portion 28. The insulating unit 29 has an insulating property, and is formed of, for example, quartz or ceramics. The insulating unit 29 extends along the outer periphery of the stage 16.

The plasma processing apparatus 10 further includes an upper electrode 30. The upper electrode 30 is provided above the stage 16. The upper electrode 30 closes the upper opening of the chamber body 12 together with a member 32. The member 32 has an insulating property. The upper electrode 30 is supported in the upper portion of the chamber body 12 though this member 32. When a first radio-frequency power supply 61 to be described later is electrically connected to the lower electrode 18, the upper electrode 30 is connected to a ground potential.

The upper electrode 30 includes a top plate 34 and a support 36. The lower surface of the top plate 34 defines the chamber 12*c*. The top plate 34 is provided with a plurality of gas ejection holes 34*a*. Each of the plurality of gas ejection holes 34*a* penetrates the top plate 34 in the plate thickness direction (the vertical direction). The top plate 34 is formed of, for example, silicon, although it is not limited thereto. Alternatively, the top plate 34 may have a structure in which a plasma-resistant film is provided on the surface of an aluminum base material. The film may be a film formed by an anodic oxidation processing or a ceramic film such as, for example, a film formed of yttrium oxide.

The support 36 is a component that detachably supports the top plate 34. The support 36 may be formed of a conductive material such as, for example, aluminum. A gas diffusion chamber 36*a* is provided inside the support 36. A plurality of gas holes 36*b* extend downward from the gas diffusion chamber 36*a*. The plurality of gas holes 36*b* communicate with the plurality of gas ejection holes 34*a*, respectively. The support 36 is provided with a gas inlet 36*c* configured to guide a processing gas to the gas diffusion chamber 36*a*, and a gas supply pipe 38 is connected to the gas inlet 36*c*.

To the gas supply pipe 38, a gas source group 40 is connected through a valve group 42 and a flow rate controller group 44. The gas source group 40 includes a plurality of gas sources. The valve group 42 includes a plurality of valves, and the flow rate controller group 44 includes a plurality of flow rate controllers. Each of the plurality of flow rate controllers of the flow rate controller group 44 is a mass flow controller or a pressure control-type flow rate controller. Each of the plurality of gas sources of the gas source group 40 is connected to the gas supply pipe 38 through a corresponding valve in the valve group 42 and a corresponding flow rate controller in the flow rate controller group 44. The plasma processing apparatus 10 is capable of supplying the gas from at least one gas source selected among the plurality of gas sources of the gas source group 40 to the chamber 12*c* at an individually regulated flow rate.

A baffle plate 48 is provided between the cylindrical portion 28 and the side wall of the chamber body 12. The baffle plate 48 may be made, for example, by coating an aluminum base material with a ceramic such as, for example, yttrium oxide. A large number of through holes are formed in the baffle plate 48. Under the baffle plate 48, an exhaust pipe 52 is connected to the bottom portion of the chamber body 12. An exhaust device 50 is connected to the exhaust pipe 52. The exhaust device 50 has a pressure controller such as, for example, an automatic pressure control valve, and a vacuum pump such as, for example, a turbo molecular pump, and is capable of decompressing the chamber body 12*c*.

As illustrated in FIGS. 1 and 2, the plasma processing apparatus 10 further includes a first radio-frequency power supply 61. The first radio-frequency power supply 61 generates first radio-frequency power waves for generating plasma by exciting the gas within the chamber 12*c*. The first radio-frequency waves have a frequency within a range of 27 MHz to 100 MHz, for example, a frequency of 60 MHz. The first radio-frequency power supply 61 is connected to the lower electrode 18 through a matching device 65 and the electrode plate 21. The matching circuit 65 is a circuit configured to match the output impedance of the first radio-frequency power supply 61 and the load side (base 18 side) impedance. The first radio-frequency power supply 61 may not be electrically connected to the lower electrode 18 or may be connected to the upper electrode 30 through the first matching circuit 65.

The plasma processing apparatus 10 further includes a second radio-frequency power supply 62. The second radio-frequency power supply 62 is a power supply configured to generate second radio-frequency waves for bias to draw ions into the substrate W. The frequency of the second radio-frequency waves is lower than the frequency of the first radio-frequency waves. The frequency of the second radio-frequency waves is in the range of 400 kHz to 13.56 MHz, for example, 400 kHz. The second radio-frequency power supply 62 is connected to the lower electrode 18 through a second matching circuit 66 of the matching device and the electrode plate 21. The matching circuit 66 is a circuit configured to match the output impedance of the second radio-frequency power supply 62 and the load side (base 18 side) impedance.

The plasma processing apparatus 10 further includes a DC power supply 70 and a switching unit 72. The DC power supply 70 a power supply configured to generate a negative DC voltage. The negative DC voltage is used as a bias voltage for drawing ions into the substrate W disposed on the stage 16. The DC power supply 70 is connected to the switching unit 72. The switching unit 72 is electrically connected to the lower electrode 18 through a radio-frequency filter 74. In the plasma processing apparatus 10, either the DC voltage generated by the DC power supply 70 or the second radio-frequency waves generated by the second radio-frequency power supply 62 is selectively supplied to the lower electrode 18.

The plasma processing apparatus 10 further includes a controller PC. The controller PC is configured to control the switching unit 72. The controller PC may be configured to further control one or both of the first radio-frequency power supply 61 and the second radio-frequency power supply 62.

In an embodiment, the plasma processing apparatus 10 may further include a main controller MC. The main controller MC is a computer including, for example, a processor, a storage device, an input device, and a display device, and controls each unit of the plasma processing apparatus 10. Specifically, the main controller MC executes a control program stored in the storage device, and controls each unit of the plasma processing apparatus 10 on the basis of recipe data stored in the storage device. Through this control, the plasma processing apparatus 10 executes a process specified by the recipe data.

Figure 3:
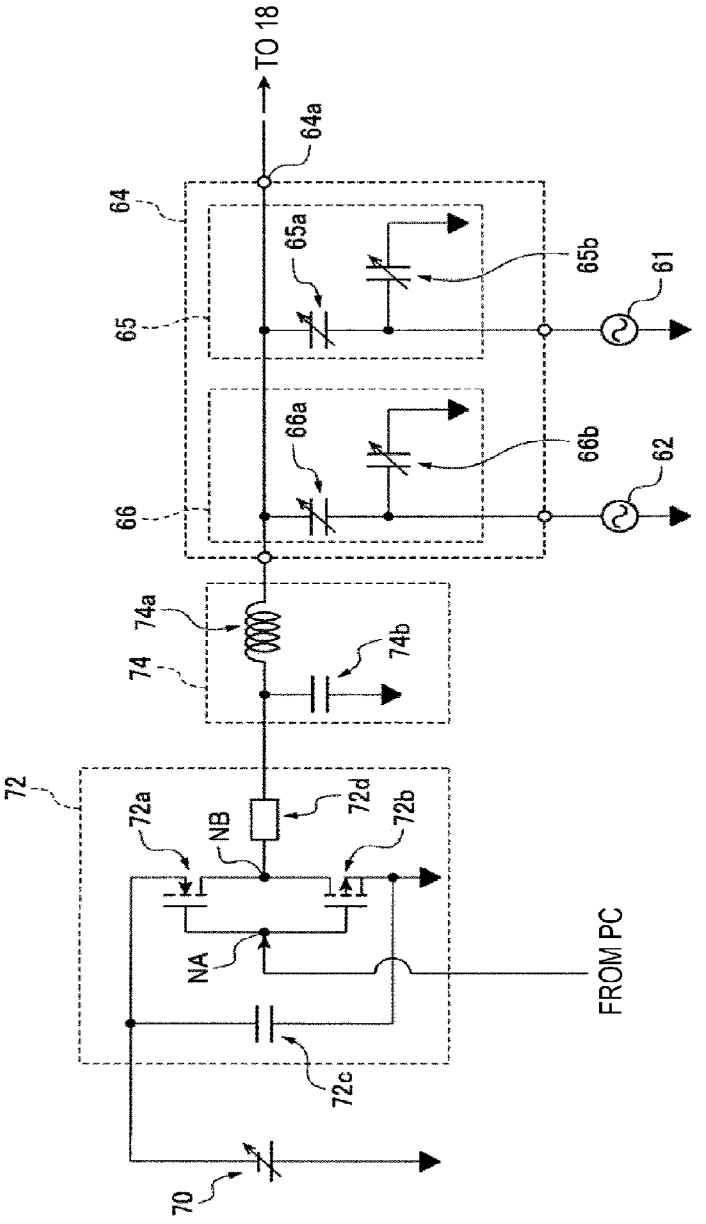
FIG. 3 is a view illustrating a circuit configuration of a DC power supply, a switching unit, a radio-frequency filter, and a matching device illustrated in FIG. 2.

Hereinafter, reference will be made to FIGS. 2 and 3, FIG. 3 is a view illustrating a circuit configuration of a DC power supply, a switching unit, a radio-frequency filter, and a matching device illustrated in FIG. 2. The DC power supply 70 is a variable DC power supply, and is configured to generate a negative DC voltage to be applied to the lower electrode 18.

The switching unit 72 is configured to be capable of stopping the application of the DC voltage from the DC power supply 70 to the lower electrode 18. In an embodiment, the switching unit 72 includes a field effect transistor (FET) 72*a*, an FET 72*b*, a capacitor 72*c*, and a resistance element 72*d*. The FET 72*a* is, for example, an N-channel MOSFET. The FET 72*b* is, for example, a P-channel MOSFET. The source of the FET 72*a* is connected to the negative pole of the DC power supply 70. One end of the capacitor 72*c* is connected to the negative electrode of the DC power supply 70 and the source of the FET 72*a*. The other end of the capacitor 72*c* is connected to the source of the FET 72*b*. The source of the FET 72*b* is connected to the ground. The gate of the FET 72*a* and the gate of the FET 72*b* are connected to each other. A node NA connected between the gate of the FET 72*a* and the gate of the FET 72*b* is supplied with a pulse control signal from the controller PC. The drain of the FET 72*a* is connected to the drain of the FET 72*b*. A node NB connected to the drain of the FET 72*a* and the drain of the FET 72*b* is connected to the radio-frequency filter 74 through the resistance element 72*d*.

The radio-frequency filter 74 is a filter configured to reduce or block radio-frequency waves. In an embodiment, the radio-frequency filter 74 includes an inductor 74*a* and a capacitor 74*b*. One end of the inductor 74*a* is connected to the resistance element 72*d*. One end of the capacitor 74*b* is connected to the one end of the inductor 74*a*. The other end of the capacitor 74*b* is connected to the ground. The other end of the inductor 74*a* is connected to the matching device 64.

The matching device 64 includes a first matching circuit 65 and a second matching circuit 66. In an embodiment, the first matching circuit 65 includes a variable capacitor 65*a* and a variable capacitor 65*b*, and the second matching circuit 66 includes a variable capacitor 66*a* and a variable capacitor 66*b*. One end of the variable capacitor 65*a* is connected to the other end of the inductor 74*a*. The other end of the variable capacitor 65*a* is connected to the first radio-frequency power supply 61 and one end of the variable capacitor 65*b*. The other end of the variable capacitor 65*b* is connected to the ground. One end of the variable capacitor 66*a* is connected to the other end of the inductor 74*a*. The other end of the variable capacitor 66*a* is connected to the second radio-frequency power supply 62 and one end of the variable capacitor 66*b*. The other end of the variable capacitor 66*b* is connected to the ground. The one end of the variable capacitor 65*a* and the one end of the variable capacitor 66*a* are connected to a terminal 64*a* of the matching device 64. The terminal 64*a* of the matching device 64 is connected to the lower electrode 18 through the electrode plate 21.

Figure 4:
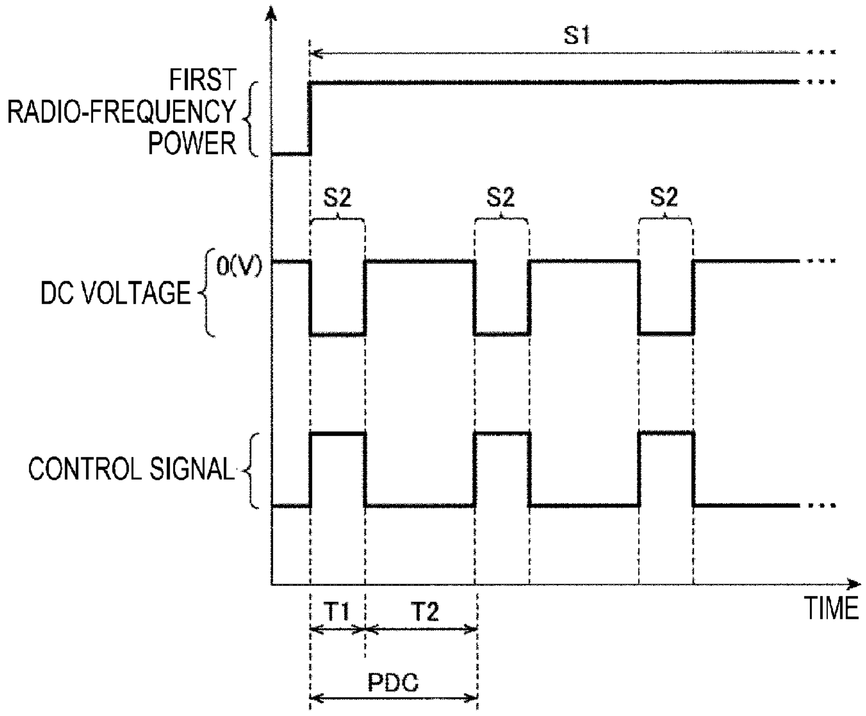
FIG. 4 is a timing chart related to a plasma processing method of an embodiment performed using the plasma processing apparatus illustrated in FIG. 1.

Hereinafter, the control by the main controller MC and the controller PC will be described. In the following description, reference is made to FIGS. 2 and 4. FIG. 4 is a timing chart related to a plasma processing method of an embodiment performed using the plasma processing apparatus illustrated in FIG. 1. In FIG. 4, the horizontal axis represents time. In FIG. 4, the vertical axis represents a first radio-frequency power, a DC voltage applied from the DC power supply 70 to the lower electrode 18, and a control signal output from the controller PC. In FIG. 4, when the first radio-frequency power is at a high level, it indicates that first radio-frequency waves are supplied for plasma generation, and when the first radio-frequency power is at a low level, it indicates that the supply of the first radio-frequency waves is stopped. In addition, in FIG. 4, when the DC voltage is at a low level, it indicates that a negative DC voltage is applied from the DC power supply 70 to the lower electrode 18, and when the DC voltage is 0 V, it indicates that no DC voltage is supplied from the DC power supply 70 to the lower electrode 18.

The main controller MC designates the power and the frequency of the first radio-frequency waves to the first radio-frequency power supply 61. Further, in an embodiment, the main controller MC designates the timing at which the supply of the first radio-frequency waves is initiated and the timing at which the supply of the first radio-frequency waves is terminated to the first radio-frequency power supply 61. During the period in which the first radio-frequency waves are supplied by the first radio-frequency power supply 61, plasma of the gas in the chamber is generated. That is, in this period, a step of supplying radio-frequency waves from a radio-frequency power supply (S1) is performed in order to generate plasma. Meanwhile, in the example of FIG. 4, the first radio-frequency waves are continuously supplied during the execution of the plasma processing method of an embodiment.

The main controller MC designates a frequency (hereinafter referred to as a "DC frequency") and a duty ratio defining each cycle in which a negative DC voltage applied from the DC power supply 70 to the lower electrode 18, to the controller PC. The duty ratio is a ratio occupied by a period during which the negative DC voltage from the DC power supply 70 is applied to the lower electrode 18 ("T1" in FIG. 4) in each cycle ("PDC" in FIG. 4). The DC frequency is set to be lower than 1 MHz. For example, the DC frequency is set to be within a range of 50 kHz to 800 kHz. The duty ratio is regulated in the state in which the DC frequency is set to be less than 1 MHz. For example, the duty ratio may be regulated to 50% or less, and may be regulated to 35% or less.

The controller PC generates a control signal in accordance with the DC frequency and the duty ratio designated from the main controller MC. The control signal generated by the controller PC may be a pulse signal. In an example, as illustrated in FIG. 4, the control signal generated by the controller PC has a high level in period T1 and a low level in period T2. The period T2 is a period excluding one period T1 in one cycle PDC. Alternatively, the control signal generated by the controller PC may have a low level in the period T1 and a high level in the period T2.

In an embodiment, the control signal generated by the controller PC is given to the node NA of the switching unit 72. When the control signal is given, in period T1, the switching unit 72 connects the DC power and the node NB such that the negative DC voltage from the DC power supply 70 is applied to the lower electrode 18. Meanwhile, in period T2, the switching unit 72 cuts off the connection between the DC power supply 70 and the node NB such that the negative DC voltage from the DC power supply 70 is not applied to the lower electrode 18. Through this, as illustrated in FIG. 4, during period T1, the negative DC voltage from the DC power supply 70 is applied to the lower electrode 18, and during period T2, application of the negative DC voltage from the DC power supply 70 to the lower electrode 18 is stopped. That is, in the plasma processing method of an embodiment, a step of cyclically applying the negative DC voltage from the DC power supply 70 to the lower electrode 18 (S2) is performed.

Figure 5A:
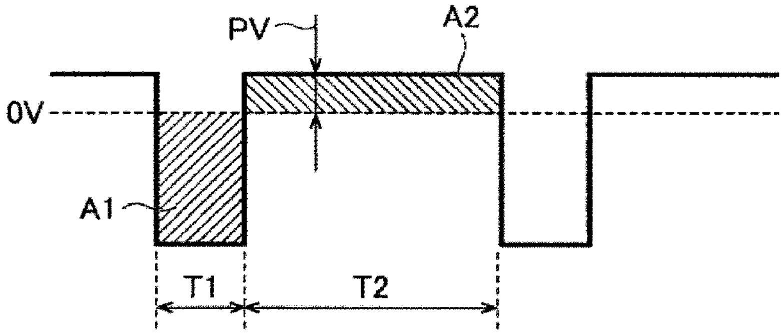
FIGS. 5A and 5B are timing charts each illustrating the potential of plasma.
Figure 5B:
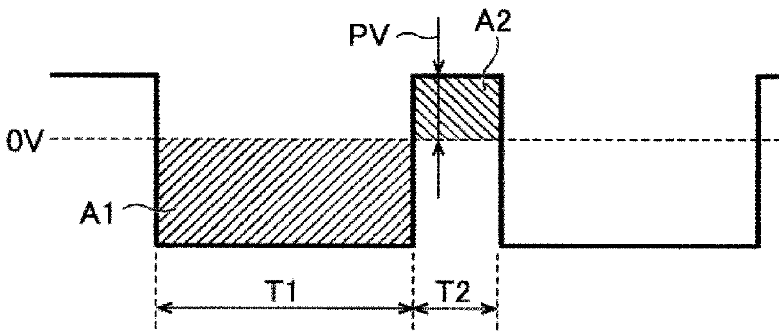

Here, a relationship between a duty ratio and a potential of plasma will be described with reference to FIGS. 5A and 5B. FIGS. 5A and 5B are timing charts each representing a potential of plasma. In period T1, since the negative DC voltage from the DC power supply 70 is applied to the lower electrode 18, the positive ions in the plasma move toward the substrate W. Therefore, as illustrated in FIGS. 5A and 5B, in period T1, the potential of the plasma is lowered. Meanwhile, in period T2, since the application of the negative DC voltage from the DC power supply 70 to the lower electrode 18 is stopped, the movement of positive ions is reduced, and the electrons in the plasma mainly move. Therefore, in period T2, the potential of the plasma becomes higher.

In the timing chart illustrated in FIG. 5A, the duty ratio becomes smaller compared to that in the timing chart illustrated in FIG. 5B. When the various conditions regarding the generation of plasma are the same, the total amount of cations and the total amount of electrons in the plasma do not depend on the duty ratio. That is, the ratio of the area A1 between the area A2 illustrated in FIG. 5A and the ratio of the area A1 between the area A2 shown in FIG. 5B become the same. Accordingly, as the duty ratio decreases, the potential PV of the plasma in period T2 decreases.

The dependency of the etching rate of the substrate W on the duty ratio, i.e., the ratio occupied by the period T1 during which the negative DC voltage is applied to the lower electrode 18 in each cycle PDC is small. Meanwhile, when the duty ratio is regulated to a relatively small value, particularly when the duty ratio is regulated to 50% or less, the plasma potential decreases, and thus the etching rate of the chamber body 12 is greatly lowered.

Next, relationships between a DC frequency and the energy of ions radiated to a substrate W and energy of ions radiated to the inner wall of the chamber body 12 will be described with reference to FIGS. 6A to 6D and FIGS. 7A to 7D. FIGS. 6A to 6D illustrate simulation results each representing an exemplary relationship between a DC frequency and energy of ions radiated to a substrate. FIGS. 7A to 7D illustrate simulation results each representing an exemplary relationship between a DC frequency and energy of ions radiated to the inner wall of the chamber body. FIGS. 6A to 6D illustrate the results obtained by simulating the energy distribution of ions radiated to a substrate W (ion energy distribution: IED) by setting DC frequencies to 200 kHz, 400 kHz, 800 kHz, and 1.6 MHz, respectively. FIGS. 7A to 7D illustrate the results obtained by simulating the energy distribution of ions radiated to the inner wall of the chamber body 12 by setting DC frequencies to 200 kHz, 400 kHz, 800 kHz, and 1.6 MHz, respectively. Meanwhile, as other simulation conditions, the duty ratio of the negative DC voltage with respect to the lower electrode 18: 40%, the voltage value of the negative DC voltage with respect to the lower electrode 18: −450 V, the pressure in the chamber 12*c*: 30 mTorr (4.00 Pa), the processing gas supplied to the chamber 12*c*: Ar gas, and the first radio-frequency waves: 100 MHz and 500 W continuous waves were used.

Figure 6A:
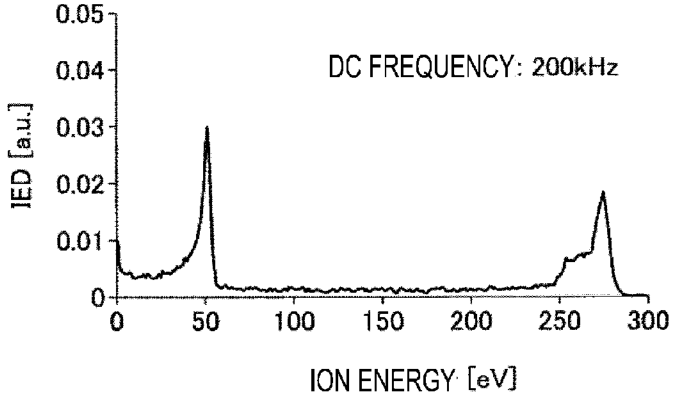
FIG. 6A illustrates a simulation result representing an exemplary relationship between a DC frequency and energy of ions radiated to a substrate.
Figure 6B:
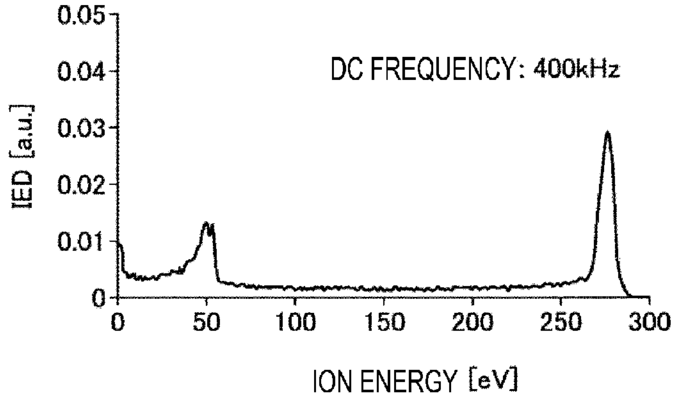
FIG. 6B illustrates a simulation result representing an exemplary relationship between a DC frequency and energy of ions radiated to a substrate.
Figure 6C:
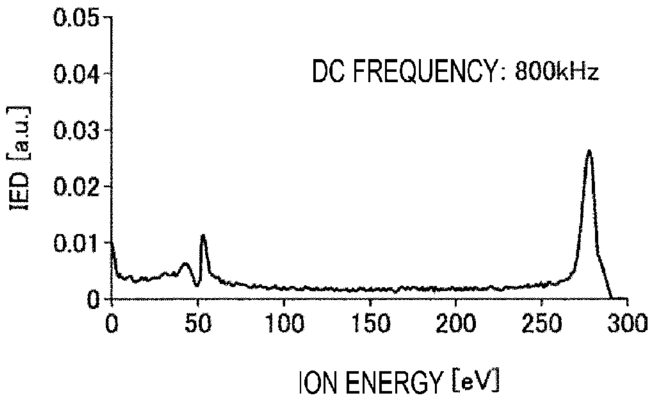
FIG. 6C illustrates a simulation result representing an exemplary relationship between a DC frequency and energy of ions radiated to a substrate.
Figure 7A:
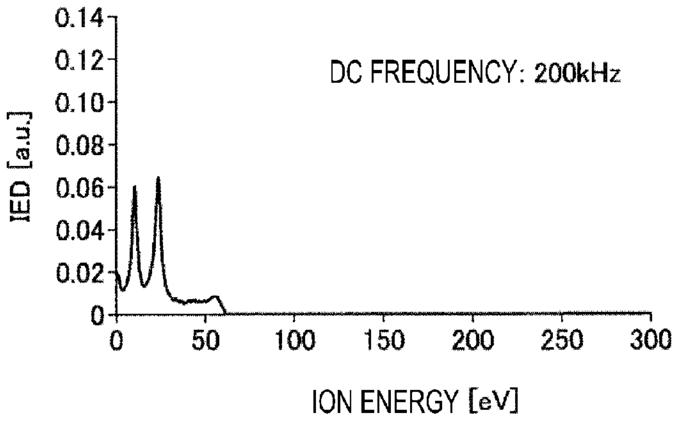
FIG. 7A illustrates a simulation result representing an exemplary relationship between a DC frequency and energy of ions radiated to the inner wall of a chamber body.
Figure 7B:
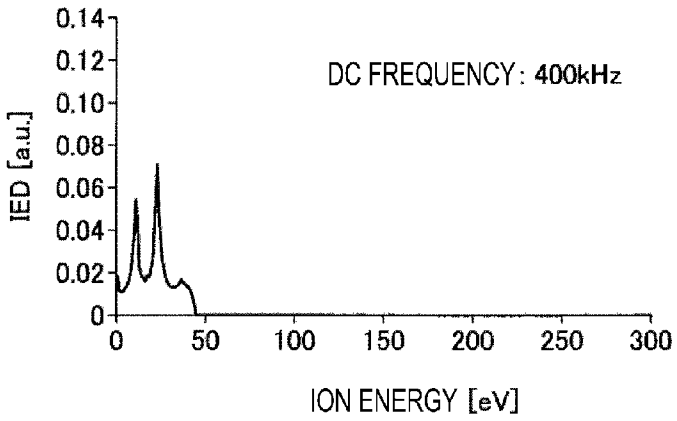
FIG. 7B illustrates a simulation result representing an exemplary relationship between a DC frequency and energy of ions radiated to the inner wall of a chamber body.
Figure 7C:
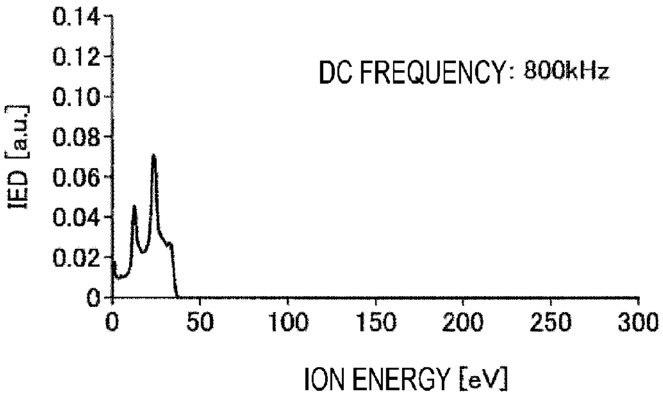
FIG. 7C illustrates a simulation result representing an exemplary relationship between a DC frequency and energy of ions radiated to the inner wall of a chamber body.

As illustrated in FIGS. 6A to 6C, when the DC frequency is 800 kHz or lower, a low-energy-side peak and a high-energy-side peak appear in the energy distribution of ions radiated to the substrate W. In addition, as illustrated in FIGS. 7A to 7C, when the DC frequency is 800 kHz or lower, a low-energy-side peak and a high-energy-side peak appear in the energy distribution of ions radiated to the inner wall of the chamber body 12. That is, when the DC frequency is 800 kHz or lower, the ions follow the DC voltage cyclically applied to the lower electrode 18.

Figure 6D:
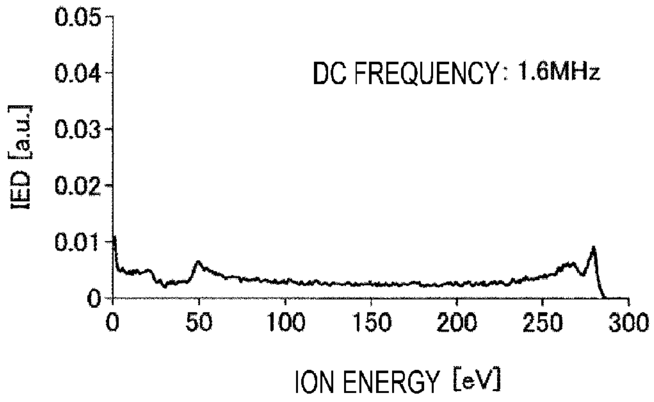
FIG. 6D illustrates a simulation result representing an exemplary relationship between a DC frequency and energy of ions radiated to the substrate.
Figure 7D:
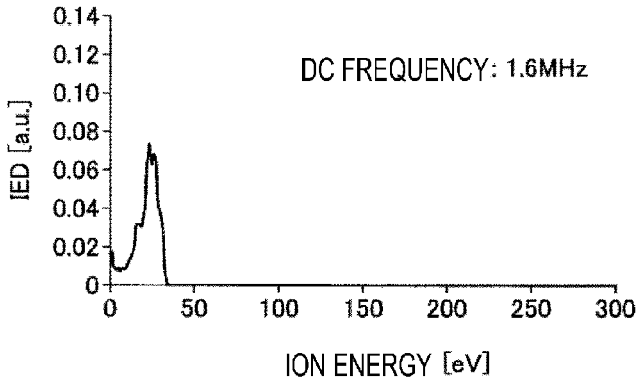
FIG. 7D illustrates a simulation result representing an exemplary relationship between a DC frequency and energy of ions radiated to the inner wall of a chamber body.

Meanwhile, as illustrated in FIG. 6D, when the DC frequency is 1.6 MHz, a low-energy-side peak and a high-energy-side peak do not appear in the energy distribution of ions radiated to the substrate W. In addition, as illustrated in FIG. 7D, when the DC frequency is 1.6 MHz, a low-energy-side peak and a high-energy-side peak do appear in the energy distribution of ions radiated to the inner wall of the chamber body 12. That is, when the DC frequency is 1.6 MHz, the ions do not follow the DC voltage cyclically applied to the lower electrode 18.

The inventor of the present application has intensively studied on the basis of the simulation results of FIGS. 6A to 6D and FIGS. 7A to 7D. As a result, the following events have been confirmed.

- When the DC frequency is set to be lower than 1 MHz, for example, in the range of 50 to 800 kHz, the ions follow the DC voltage cyclically applied to the lower electrode 18.
- Under the situation where the ions follow the DC voltage cyclically applied to the lower electrode 18, the dependency of the etching rate of the substrate W on the duty ratio of the DC voltage is small. Meanwhile, when the duty ratio is regulated to a relatively small value, particularly when the duty ratio is regulated to 50% or less, the plasma potential decreases, as described above with reference to FIG. 5A, and thus the etching rate of the chamber body 12 is greatly lowered.
- When the DC frequency is set to 1 MHz or higher, the ions do not follow the DC voltage cyclically applied to the lower electrode 18.
- Under the situation where the ions do not follow the DC voltage cyclically applied to the lower electrode 18, the energy of the ions radiated to the inner wall of the chamber body 12 tends to become higher together with the energy of the ions radiated to the substrate.

Therefore, in the plasma processing apparatus 10 of an embodiment, when the DC voltage is cyclically applied to the lower electrode 18, the duty ratio is regulated to 50% or lower in a state in which the DC frequency is set to be lower than 1 MHz. As a result, it is possible to suppress the decrease in the etching rate of the substrate W and to reduce the energy of ions radiated to the inner wall of the chamber body 12. As a result, generation of particles from the chamber body 12 is suppressed. When the duty ratio is 35% or lower, it becomes possible to further reduce the energy of ions radiated to the inner wall of the chamber body 12.

Figure 8A:
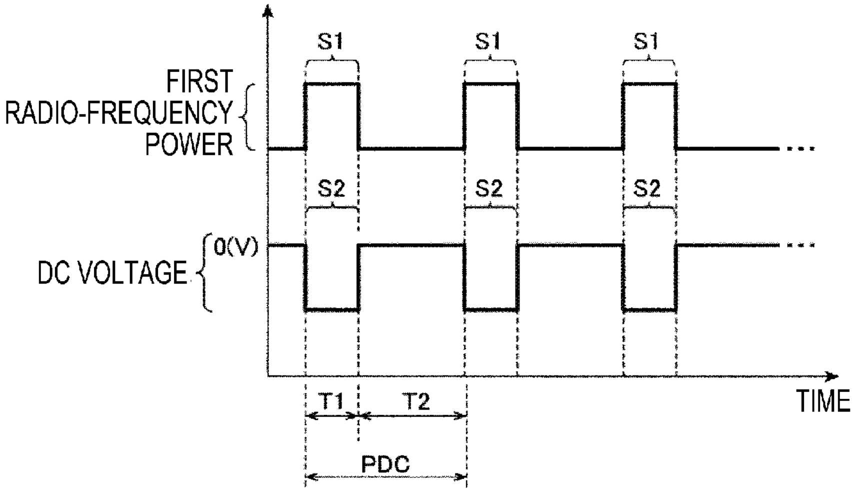
FIGS. 8A and 8B are timing charts each related to a plasma processing method of another embodiment.
Figure 8B:
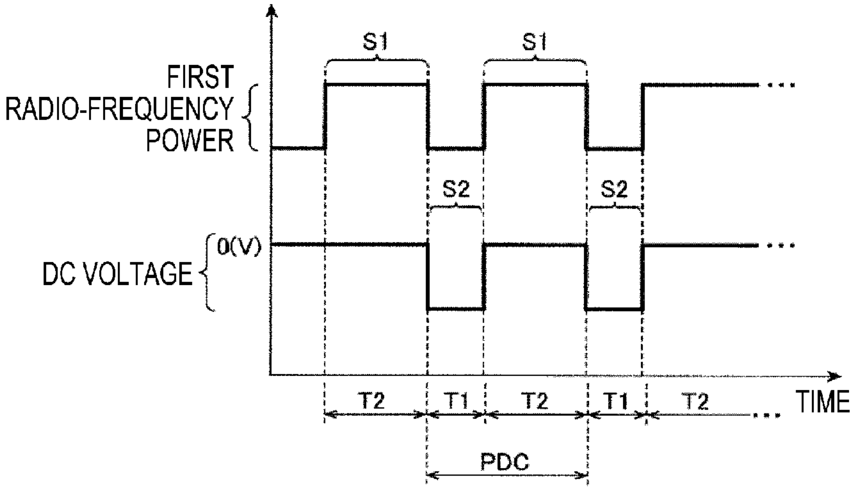

Hereinafter, another embodiment will be described. FIGS. 8A and 8B are timing charts each related to a plasma processing method of another embodiment. In each of FIGS. 8A and 8B, the horizontal axis represents time. In each of FIGS. 8A and 8B, the vertical axis represents a first radio-frequency power and a DC voltage applied from the DC power supply 70 to the lower electrode 18. In each of FIGS. 8A and 8B, when the power of the first radio-frequency power is at a high level, it indicates that first radio-frequency waves are supplied for plasma generation. In each of FIGS. 8A and 8B, when the power of the first radio-frequency power is at a low level, it indicates that the supply of first radio-frequency waves is stopped. Further, in each of FIGS. 8A and 8B, when the DE voltage is at a low level, it indicates that a negative DC voltage is applied from the DC power supply 70 to the lower electrode 18. Further, in each of FIGS. 8A and 8B, when the DE voltage is 0 V, it indicates that no DC voltage is applied from the DC power supply 70 to the lower electrode 18.

In the embodiment illustrated in FIG. 8A, a negative DC voltage from the DC power supply 70 is cyclically applied to the lower electrode 18, and first radio-frequency waves are cyclically supplied for plasma generation. In the embodiment illustrated in FIG. 8A, the application of the negative DC voltage from the DC power supply 70 to the lower electrode 18 is synchronized with the supply of the first radio-frequency waves. That is, in period T1 during which the DC voltage from the DC power supply 70 is applied to the lower electrode 18, the first radio-frequency waves are supplied, and in period T2 during which the application of the DC voltage from the DC power supply 70 to the lower electrode 18 is stopped, the supply of the first radio-frequency waves is stopped.

In the embodiment illustrated in FIG. 8B, a negative DC voltage from the DC power supply 70 is cyclically applied to the lower electrode 18, and first radio-frequency waves are cyclically supplied for plasma generation. In the embodiment illustrated in FIG. 8A, the phase of the application of the negative DC voltage from the DC power supply 70 to the lower electrode 18 is reversed with the phase of the supply of the first radio-frequency waves. That is, in period T1 during which the DC voltage from the DC power supply 70 is applied to the lower electrode 18, the supply of the first radio-frequency waves is stopped, and in period T2 during which the application of the DC voltage from the DC power supply 70 to the lower electrode 18 is stopped, the first radio-frequency waves are supplied.

In the embodiment illustrated in FIG. 8A and the embodiment illustrated in FIG. 8B, the above-mentioned control signal from the controller PC is given to the first radio-frequency power supply 61. The first radio-frequency power supply 61 initiates the supply of the first radio-frequency waves from the controller PC at the rising (or falling) timing of the control signal, and stops the supply of the first radio-frequency waves at the falling (or rising) timing of the control signal. In the embodiments illustrated in FIG. 8A and the embodiment illustrated in FIG. 8B, generation of unintended radio-frequency waves due to inter modulation distortion may be suppressed.

Figure 9:
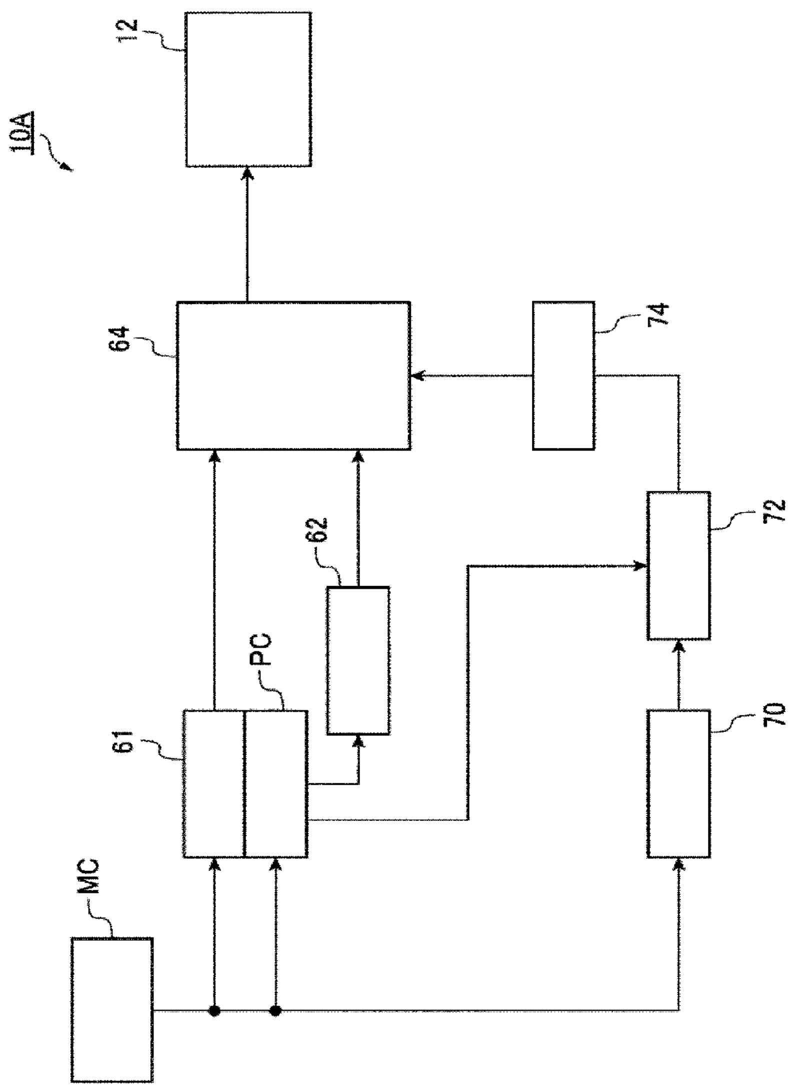
FIG. 9 is a view illustrating a power supply system and a control system of a plasma processing apparatus according to another embodiment.

Hereinafter, plasma processing apparatuses according to several other embodiments will be described. FIG. 9 is a view illustrating a power supply system and a control system of a plasma processing apparatus according to another embodiment. As illustrated in FIG. 9, a plasma processing apparatus 10A according to another embodiment is different from the plasma processing apparatus 10 in that the first radio-frequency power supply 61 includes a controller PC. That is, in the plasma processing apparatus 10A, the controller PC is a part of the first radio-frequency power supply 61. Meanwhile, in the plasma processing apparatus 10, the controller PC is separate from the first radio-frequency power supply 61 and the second radio-frequency power supply 62. In the plasma processing apparatus 10A, since the controller PC is a part of the first radio-frequency power supply 61, the above-mentioned control signal (pulse signal) from the controller PC is not transmitted to the first radio-frequency power supply 61.

Figure 10:
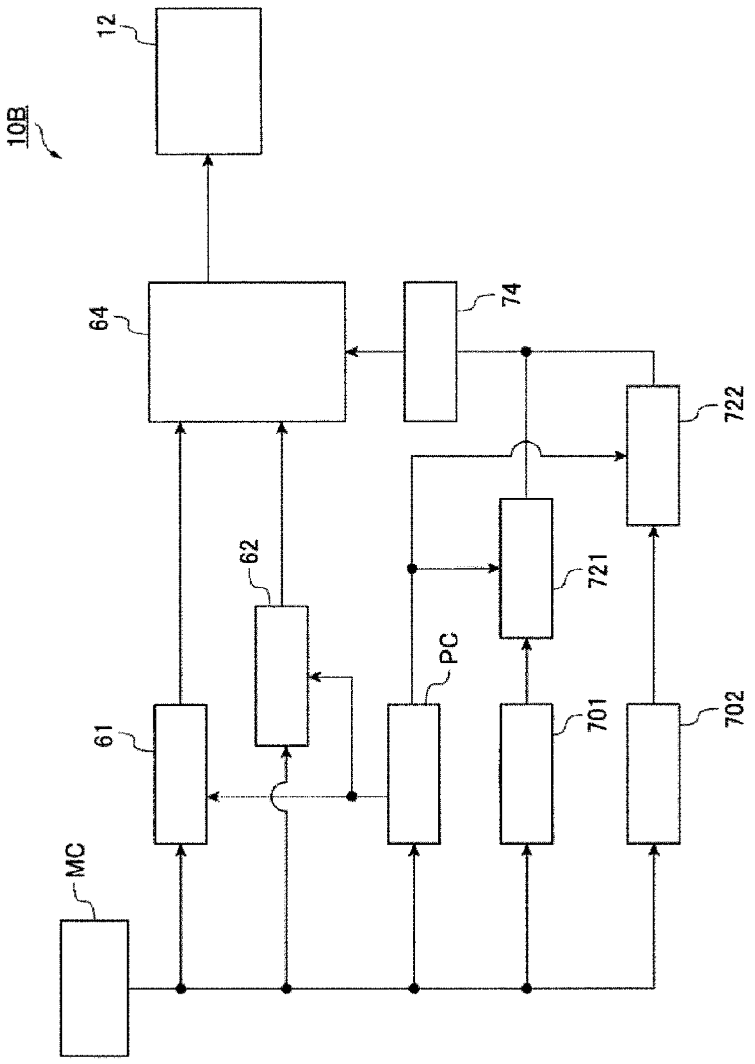
FIG. 10 is a view illustrating a power supply system and a control system of a plasma processing apparatus according to still another embodiment.

FIG. 10 is a view representing a power supply system and a control system of a plasma processing apparatus according to still another embodiment. The plasma processing apparatus 10B illustrated in FIG. 10 includes a plurality of DC power supplies 701 and 702, and a plurality of switching units 721 and 722. Each of the plurality of DC power supplies 701 and 702 is a power supply similar to the DC power supply 70, and is configured to generate a negative DC voltage applied to the lower electrode 18. Each of the plurality of switching units 721 and 722 has the same configuration as that of the switching unit 72. The DC power supply 701 is connected to the switching unit 721. Similar to the switching unit 72, the switching unit 721 is configured to be capable of stopping the application of the DC voltage from the DC power supply 701 to the lower electrode 18. The DC power supply 702 is connected to the switching unit 722. Similar to the switching unit 72, the switching unit 722 is configured to be capable of stopping the application of the DC voltage from the DC power supply 702 to the lower electrode 18.

Figure 11:
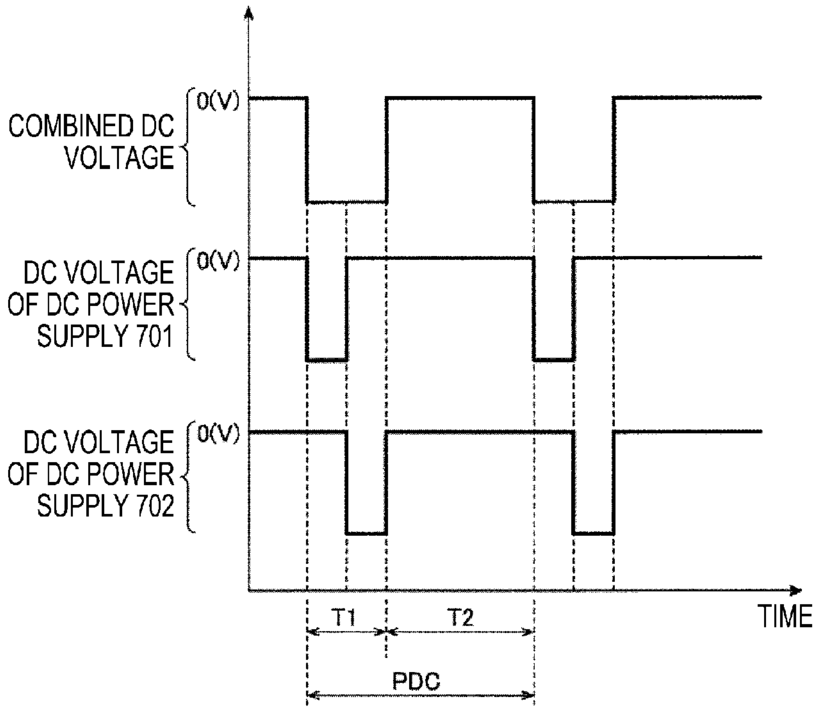
FIG. 11 is a timing chart related to a plasma processing method of an embodiment performed using the plasma processing apparatus illustrated in FIG. 10.

FIG. 11 is a timing chart related to a plasma processing method of an embodiment performed using the plasma processing apparatus illustrated in FIG. 10. In FIG. 11, the horizontal axis represents time. In FIG. 11, the vertical axis indicates a combined DC voltage, the DC voltage of the DC power supply 701, and the DC voltage of the DC power supply 702. The DC voltage of the DC power supply 701 indicates a DC voltage applied to the lower electrode 18 from the DC power supply 701, and the DC voltage of the direct current power supply 702 indicates a DC voltage applied to the lower electrode 18 from the DC power supply 702. The combined DC voltage is applied to the lower electrode 18 in each cycle PDC. As illustrated in FIG. 11, in the plasma processing apparatus 10B, the DC voltage applied to the lower electrode 18 in each cycle PDC is formed by a plurality of DC voltages sequentially output from the plurality of DC power supplies 701 and 702. That is, in the plasma processing apparatus 10B, the DC voltage applied to the lower electrode 18 in each cycle PDC is formed by temporally combining a plurality of DC voltages sequentially output from the plurality of DC power supplies 701 and 702. According to this plasma processing apparatus 10B, the load on each of the plurality of DC power supplies 701 and 702 is reduced.

In the plasma processing apparatus 10B that executes the plasma processing method illustrated in FIG. 11, the controller PC supplies the first control signal to the switching unit 721. The first control signal has a high level (or a low level) in a period in which the DC voltage from the DC power supply 701 is applied to the lower electrode 18 and has a low level (or a high level) in a period in which no DC voltage from the DC power supply 701 is applied to the lower electrode 18. In addition, the controller PC also supplies a second control signal to the switching unit 722. The second control signal has a high level (or low level) in a period in which the DC voltage from the DC power supply 702 is applied to the lower electrode 18 and has a low level (or a high level) in a period in which the DC voltage from the DC power supply 702 is not applied to the lower electrode 18. That is, control signals (pulse signals) having different phases are supplied to the plurality of switching units 721 and 722 connected to the plurality of DC power supplies.

Figure 12:
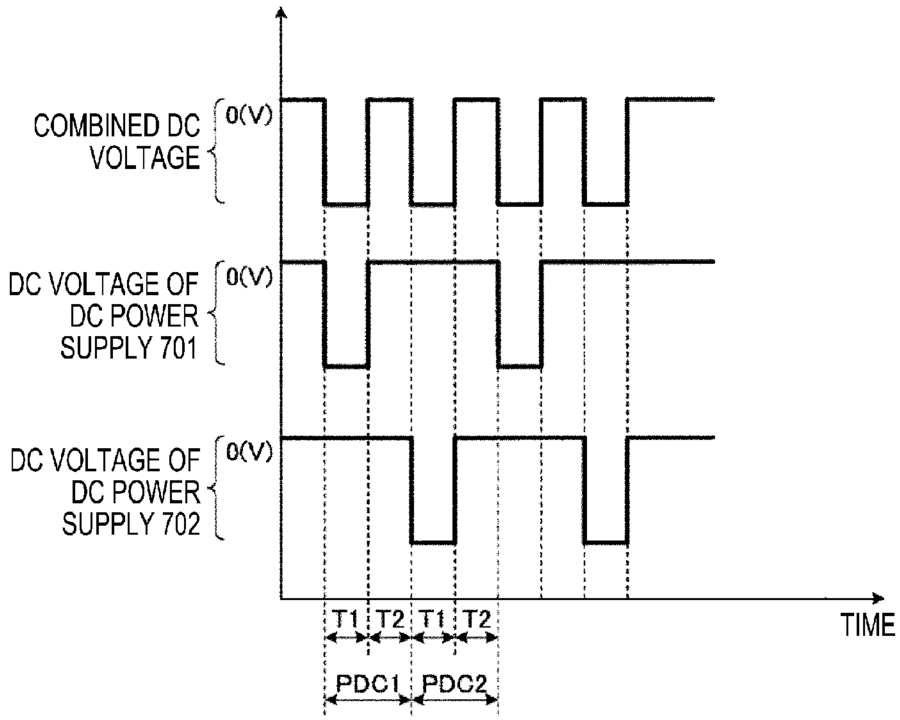
FIG. 12 is a timing chart related to a plasma processing method of another embodiment performed using the plasma processing apparatus illustrated in FIG. 10.

FIG. 12 is a timing chart related to a plasma processing method of another embodiment performed using the plasma processing apparatus illustrated in FIG. 10. In FIG. 12, the horizontal axis represents time. In FIG. 12, the vertical axis indicates a combined DC voltage, the DC voltage of the DC power supply 701, and the DC voltage of the DC power supply 702. The DC voltage of the DC power supply 701 indicates a DC voltage applied to the lower electrode 18 from the DC power supply 701, and the DC voltage of the direct current power supply 702 indicates a DC voltage applied to the lower electrode 18 from the DC power supply 702. The combined DC voltage is applied to the lower electrode 18 in each cycle PDC. As illustrated in FIG. 12, in the plasma processing apparatus 10B, the DC voltages applied to the lower electrode 18 in adjacent cycles PDC1 and PDC2 are formed by a plurality of DC voltages sequentially output from the plurality of DC power supplies 701 and 702 and having phases which are shifted by 90 degrees. That is, in the plasma processing apparatus 10B, the DC voltages applied to the lower electrode 18 in adjacent cycles PDC1 and PDC2 are generated by temporally combining the plurality of DC voltages sequentially output from the plurality of DC power supplies 701 and 702 and shifted in phase by 90 degrees. The frequency of the DC voltage generated by temporally combining the plurality of DC voltages sequentially output from the plurality of DC power supplies 701 and 702 and shifted in phase by 90 degrees becomes twice the frequency of the DC voltage output from each of the plurality of DC power supplies 701 and 702.

In the plasma processing apparatus 10B that executes the plasma processing method illustrated in FIG. 12, the controller PC supplies a third control signal to the switching unit 721. The third control signal has a high level (or a low level) in a period in which the DC voltage from the DC power supply 701 is applied to the lower electrode 18 and has a low level (or a high level) in a period in which no DC voltage from the DC power supply 701 is applied to the lower electrode 18. In addition, the controller PC also supplies a fourth control signal to the switching unit 722. The fourth control signal has a high level (or low level) in a period in which the DC voltage from the DC power supply 702 is applied to the lower electrode 18 and has a low level (or a high level) in a period in which the DC voltage from the DC power supply 702 is not applied to the lower electrode 18. With respect to the phase of the third control signal, the phase of the fourth control signal is shifted by 90 degrees. That is, control signals (pulse signals) shifted in phase by 90 degrees are supplied to the plurality of switching units 721 and 722 connected to the plurality of DC power supplies 701 and 702, respectively. In addition, the frequency of the third control signal and the frequency of the fourth control signal become ½ times the frequency of the DC voltage generated by temporally combining the plurality of DC voltages sequentially output from the plurality of DC power supplies 701 and 702 and shifted in phase by 90 degrees. According to this plasma processing apparatus 10B, it is possible to reduce the frequency of the control signal (pulse signal) supplied to each of the plurality of switching units 721 and 722 connected to the plurality of DC power supplies 701 and 702. As a result, according to this plasma processing apparatus 10B, it is possible to suppress heat generation associated with the control of each of the plurality of switching units 721 and 722.

Figure 13:
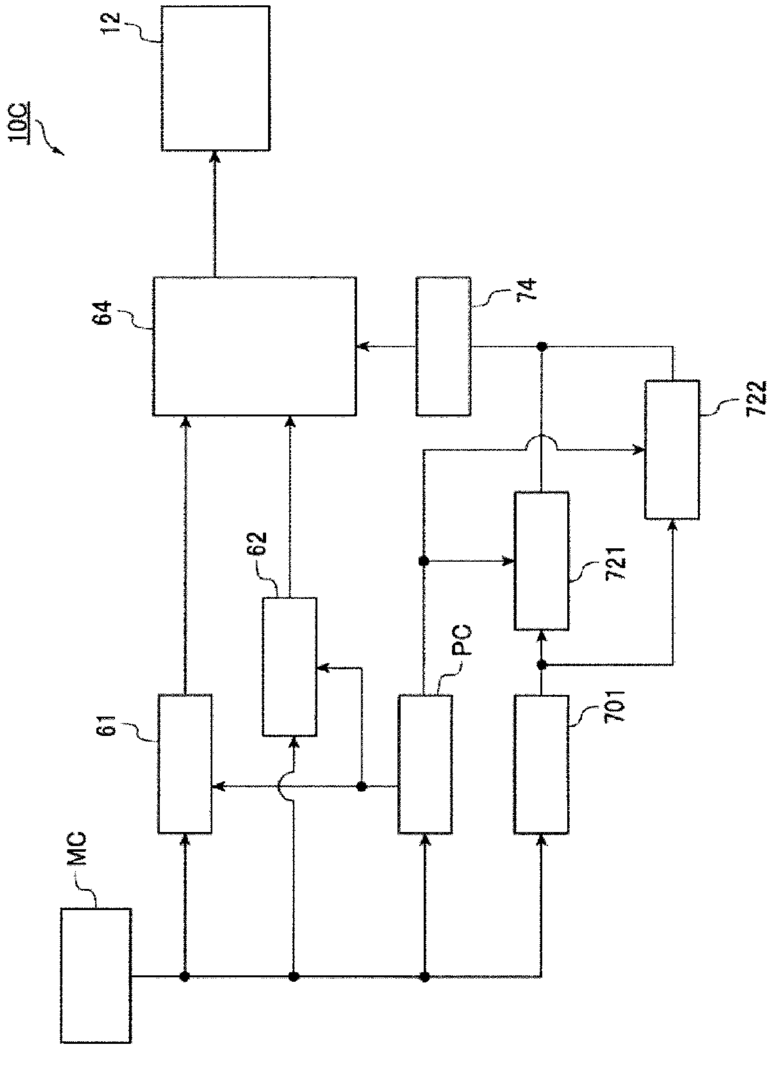
FIG. 13 is a view illustrating a power supply system and a control system of a plasma processing apparatus according to another embodiment.

FIG. 13 is a view representing a power supply system and a control system of a plasma processing apparatus according to another embodiment. As illustrated in FIG. 13, a plasma processing apparatus 10C according to another embodiment is different from the plasma processing apparatus 10 in that the DC power supply 702 is omitted. In the plasma processing apparatus 10C, the DC power supply 701 is connected to the switching unit 721 and the switching unit 722.

Figure 14:
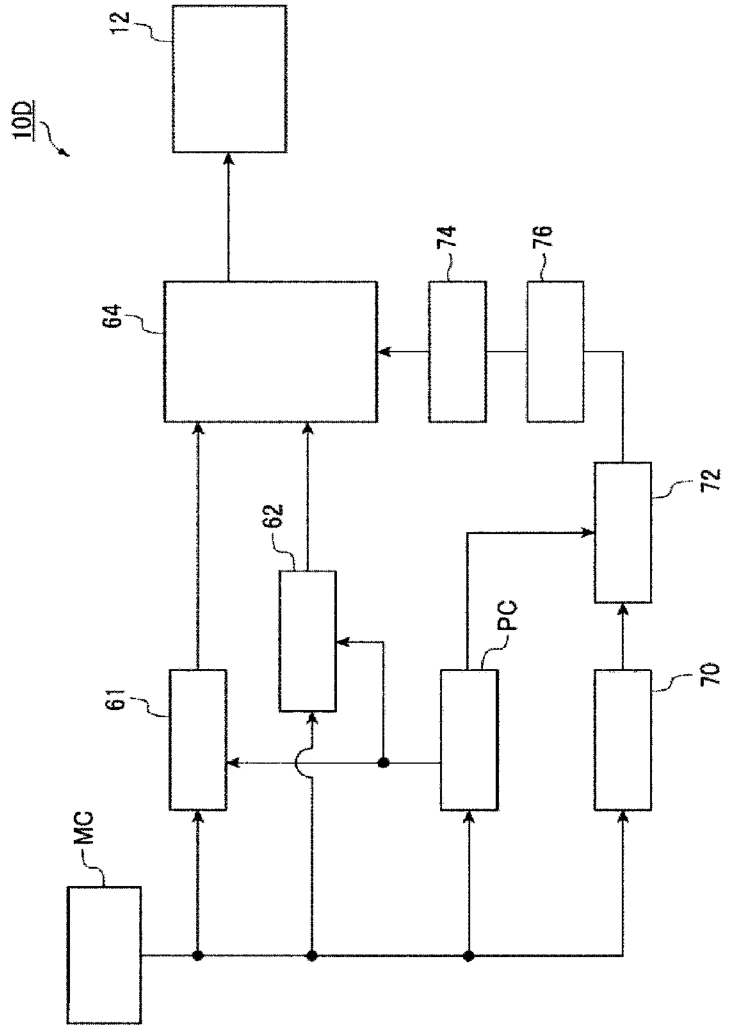
FIG. 14 is a view illustrating a power supply system and a control system of a plasma processing apparatus according to still another embodiment.

FIG. 14 is a view illustrating a power supply system and a control system of a plasma processing apparatus according to still another embodiment. The plasma processing apparatus 10D illustrated in FIG. 14 is different from the plasma processing apparatus 10 in that the plasma processing apparatus 10D further includes a waveform regulator 76. The waveform regulator 76 is connected between the switching unit 72 and the radio-frequency filter 74. The waveform regulator 76 regulates the waveform of the DC power output from the DC power supply 70 through the switching unit 72, that is, the DC voltage alternately having a negative polarity value and a value of 0 V. Specifically, the waveform regulator 76 regulates the waveform of the DC voltage such that the waveform of the DC voltage applied to the lower electrode 18 has a substantially triangular shape. The waveform regulator 76 is, for example, an integration circuit.

Figure 15:
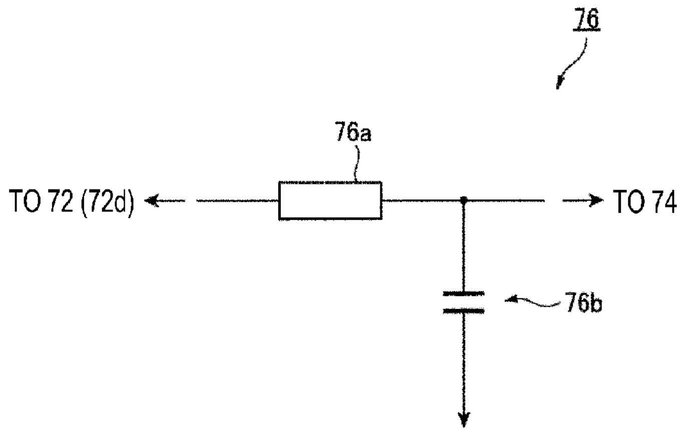
FIG. 15 is a circuit diagram showing an exemplary waveform regulator.

FIG. 15 is a circuit diagram illustrating an example of the waveform regulator 76. The waveform regulator 76 illustrated in FIG. 15 is configured as an integration circuit, and includes a resistance element 76*a* and a capacitor 76*b*. One end of the resistance element 76*a* is connected to a resistance element 72*d* of the switching unit 72, and the other end of the resistance element 76*a* is connected to the radio-frequency filter 74. One end of the capacitor 76*b* is connected to the other end of the resistance element 76*a*. The other end of the capacitor 76*b* is connected to the ground. In the waveform regulator 76 illustrated in FIG. 15, the rising and falling of the DC voltage output from the switching unit 72 are delayed depending on a time constant determined by the resistance value of the resistance element 76*a* and the capacitance value of the capacitor 76*b*. Therefore, according to the waveform regulator 76 illustrated in FIG. 15, it is possible to apply a voltage having a triangular waveform to the lower electrode 18 in a pseudo manner According to the plasma processing apparatus 10D including the waveform regulator 76, it is possible to regulate the energy of ions radiated to the inner wall of the chamber body 12.

Although various embodiments have been described above, various modifications can be made without being limited to the above-described embodiments. For example, the plasma processing apparatuses of the various embodiments described above may not have the second radio-frequency power supply 62. That is, the plasma processing apparatuses of the various embodiments described above may have a single radio-frequency power supply.

In addition, in the various embodiments described above, the application of the negative DC voltage from the DC power supply to the lower electrode 18 and the stop of the application are switched by the switching unit. However, when the DC power supply itself is configured to switch the output of the negative DC voltage and the stop of the output, the switching unit is not required.

In addition, in the various embodiments described above, a case in which the frequency that defines each cycle in which the DC voltage is applied to the lower electrode 18 defines each cycle, that is, the DC frequency, is set to a predetermined value less than 1 MHz has been described by way of an example, the DC frequency may be decreased with the elapse of time. As a result, even when the depth of a hole or a groove formed by etching the substrate by plasma becomes deeper, it is possible to suppress the deterioration of rectilinearity of ions in the hole or the groove, and as a result it is possible to suppress the deterioration of etching characteristics.

In addition, it is possible to use the characteristic configurations of the various embodiments described above in any combination. In addition, although the plasma processing apparatuses according to the various embodiments described above are capacitively coupled plasma processing apparatuses, the plasma processing apparatus in a modification may be an inductively coupled plasma processing apparatus.

Meanwhile, when the duty ratio is high, the energy of ions radiated to the chamber body 12 is large. Therefore, by setting the duty ratio to a high value, for example, by setting the duty ratio to a value larger than 50%, it becomes possible to perform cleaning on the inner wall of the chamber body 12.

Hereinafter, evaluation tests performed on a plasma processing method using the plasma processing apparatus 10 will be described.

(First Evaluation Test)

In the first evaluation test, a sample having a silicon oxide film was attached to each of the side wall of the chamber body 12 and the chamber 12*c* side surface of the top plate 34 of the plasma processing apparatus 10, and a sample having a silicon oxide film was placed on the electrostatic chuck 20. Then, in the first evaluation test, a plasma processing was performed under the conditions represented below. Meanwhile, in the first evaluation test, the duty ratio of the negative DC voltage cyclically applied to the lower electrode 18 was used as a variable parameter.

<Plasma Processing Conditions in First Evaluation Test>

Pressure of chamber 12*c*: 20 mTorr (2.66 Pa)

Flow rate of gas supplied to chamber 12*c*

- $C_4F_8$ gas: 24 sccm
- $O_2$ gas: 16 sccm
- Ar gas: 150 sccm

First radio-frequency wave: 100 MHz, continuous waves of 500 W

Negative DC voltage with respect to lower electrode 18

- Voltage value: −3000 V
- Frequency (DC frequency): 200 kHz

Processing time: 60 sec

Figure 16A:
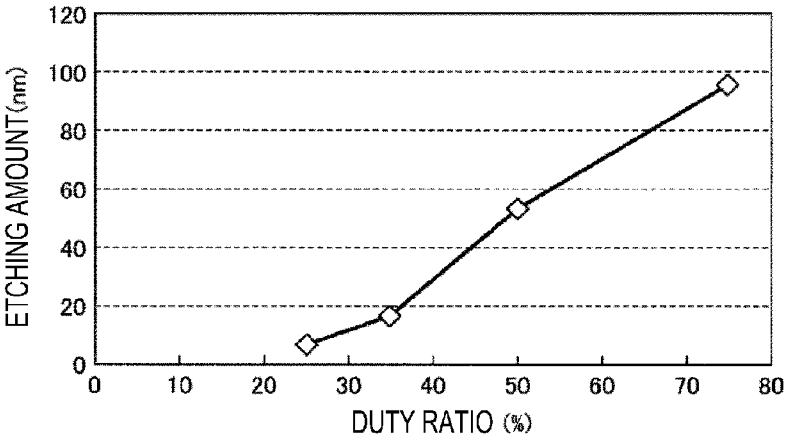
FIG. 16A is a graph representing a relationship between a duty ratio and an etching amount of a silicon oxide film on a sample attached to the chamber side surface of the top plate, in which the duty ratio and the etching amount were obtained in a first evaluation test.
Figure 16B:
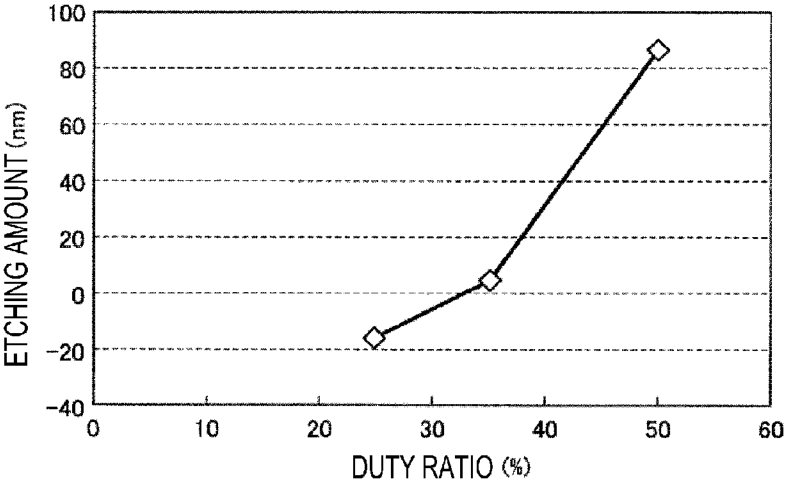
FIG. 16B is a graph representing a relationship between a duty ratio and an etching amount of a silicon oxide film on a sample attached to the side wall of the chamber body, which the duty ratio and the etching amount were obtained in the first evaluation test.
Figure 17:
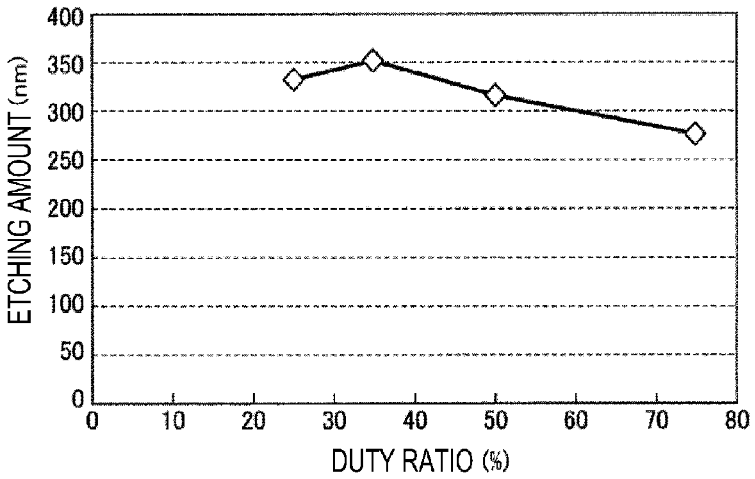
FIG. 17 is a graph representing a relationship between a duty ratio and an etching amount of a silicon oxide film on a sample placed on the electrostatic chuck, in which the duty ratio and the etching amount were obtained in the first evaluation test.

In the first evaluation test, the etching amount (the reduction amount in film thickness) of the silicon oxide film on the sample attached to the chamber 12 side surface of the top plate 34 was measured. In the first evaluation test, the etching amount (the reduction amount in film thickness) of the silicon oxide film of the sample attached to the side wall of the chamber body 12 was measured. In addition, in the first evaluation test, the etching amount (the reduction amount in film thickness) of the silicon oxide film of the sample placed on the electrostatic chuck 20 was measured. FIG. 16A is a graph representing the relationship between the duty ratio and the etching amount of the silicon oxide film on the sample attached to the chamber 12*c* side surface of the top plate 34, in which the duty ratio and the etching amount were obtained in the first evaluation test. FIG. 16B is a graph representing the relationship between the duty ratio and the etching amount of a silicon oxide film on the sample attached to the side wall of the chamber body 12, in which the duty ratio and the etching amount were obtained in the first evaluation test. FIG. 17 is a graph representing the relationship between the duty ratio and the etching amount of the silicon oxide film on the sample placed on an electrostatic chuck, which the duty ratio and the etching amount were obtained in the first evaluation test.

As illustrated in FIG. 17, the dependency of the etching amount of the silicon oxide film of the sample placed on the electrostatic chuck 20 on the duty ratio was small. In addition, as illustrated in FIGS. 16A and 16B, when the duty ratio is 35% or less, the etching amount of the silicon oxide film on the sample attached to the chamber 12*c* side surface of the top plate 34 was considerably small. In addition, as illustrated in FIGS. 16A and 16B, when the duty ratio is 35% or less, the etching amount of the silicon oxide film on the sample attached to the side wall of the chamber body 12 was considerably small. Accordingly, through the first evaluation test, it was confirmed that the dependency of the etching rate of the substrate on the duty ratio occupied by the period during which the negative DC voltage is applied to the lower electrode 18 in each cycle PDC was small. In addition, it was confirmed that when the duty ratio was small, particularly when the duty ratio was 35% or less, the etching rate of the chamber body 12 was greatly reduced, that is, the energy of ions radiated to the inner wall of the chamber body 12 was reduced. Meanwhile, from the graphs of FIGS. 16A and 16B, when the duty ratio is 50% or less, it is estimated that the energy of ions radiated to the inner wall of the chamber main body 12 is considerably reduced.

(Second Evaluation Test)

In the second evaluation test, a sample having a silicon oxide film was attached to each of the side wall of the chamber body 12 and the chamber 12*c* side surface of the top plate 34 of the plasma processing apparatus 10, and a sample having a silicon oxide film was placed on the electrostatic chuck 20. Then, in the second evaluation test, a plasma processing was performed under the conditions represented below.

<Plasma Processing Conditions in Second Evaluation Test>

Pressure of chamber 12*c*: 20 mTorr (2.66 Pa)
Flow rate of gas supplied to chamber 12*c*
- $C_4F_8$ gas: 24 sccm
- $O_2$ gas: 16 sccm
- Ar gas: 150 sccm First radio-frequency wave: 100 MHz, continuous waves of 500 W
Negative DC voltage with respect to lower electrode 18
- Voltage value: −3000 V
- Frequency (DC frequency): 200 kHz
- Duty ratio: 35%

Processing time: 60 sec

In the comparative test, a sample having a silicon oxide film was attached to each of the side wall of the chamber body 12 and the chamber 12*c* side surface of the top plate 34 of the plasma processing apparatus 10, and a sample having a silicon oxide film was placed on the electrostatic chuck 20. Then, in the comparative test, a plasma processing was performed under the conditions represented below. Meanwhile, the conditions of the second radio-frequency waves in the comparative test were set such that that the etching amounts (the reduction amount in film thickness) of the silicon oxide films on the samples placed on the electrostatic chuck 20 were substantially equivalent to each other in the plasma processing in the second evaluation test and the comparative test.

<Plasma Processing Conditions in Comparative Test>

Figure 18A:
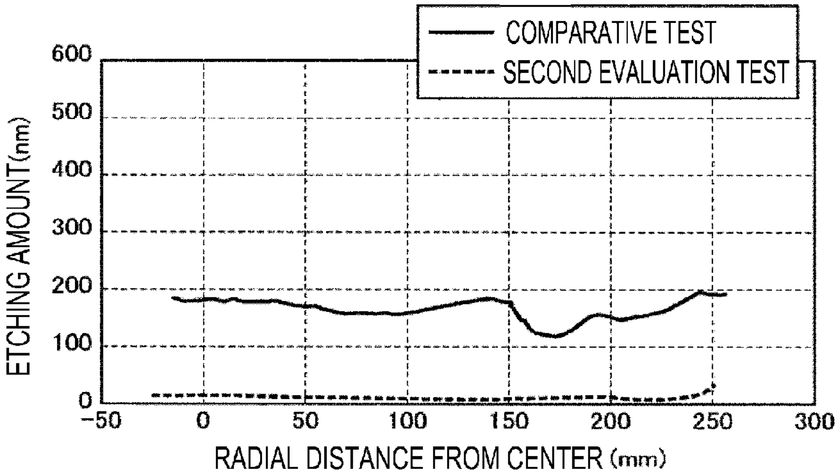
FIG. 18A illustrates graphs each representing an etching amount of a silicon oxide film on a sample attached to the chamber side surface of the top plate, in which the etching amount was obtained in each of a second evaluation text and a comparative test.
Figure 18B:
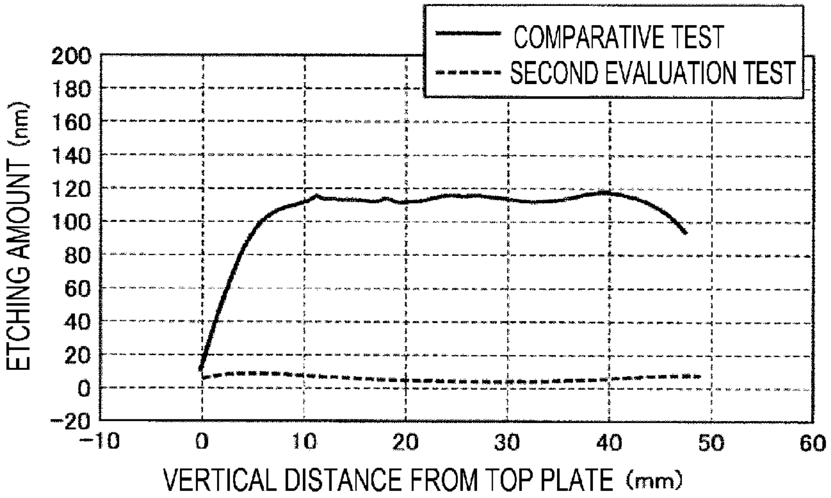
FIG. 18B illustrates graphs each representing an etching amount of a silicon oxide film on a sample attached to the side wall of the chamber body, in which the etching amount was obtained in each of the second evaluation test and the comparative test.
Figure 19A:
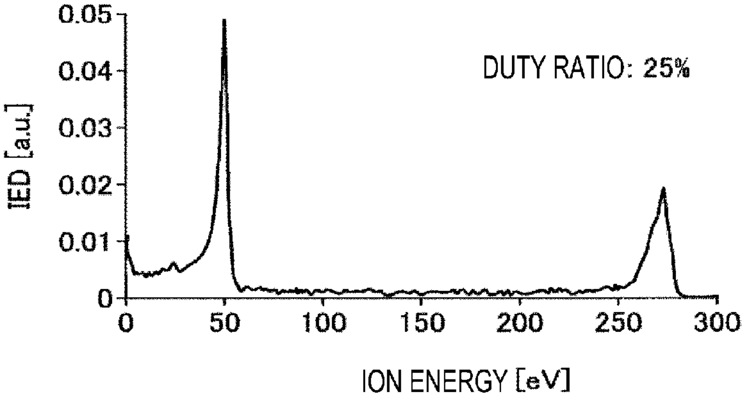
FIG. 19A illustrates a simulation result representing an exemplary relationship between a duty ratio and energy of ions radiated to a substrate.
Figure 19B:
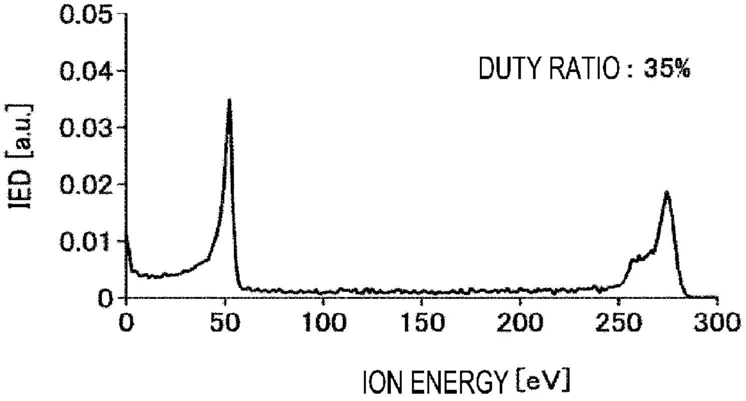
FIG. 19B illustrates a simulation result representing an exemplary relationship between a duty ratio and energy of ions radiated to a substrate.
Figure 19C:
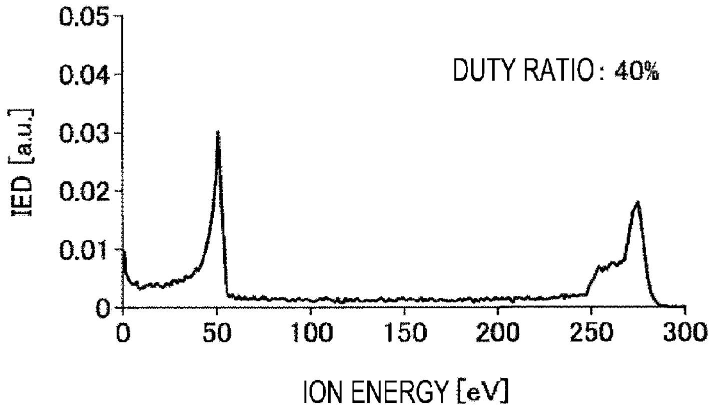
FIG. 19C illustrates a simulation result representing an exemplary relationship between a duty ratio and energy of ions radiated to a substrate.
Figure 19D:
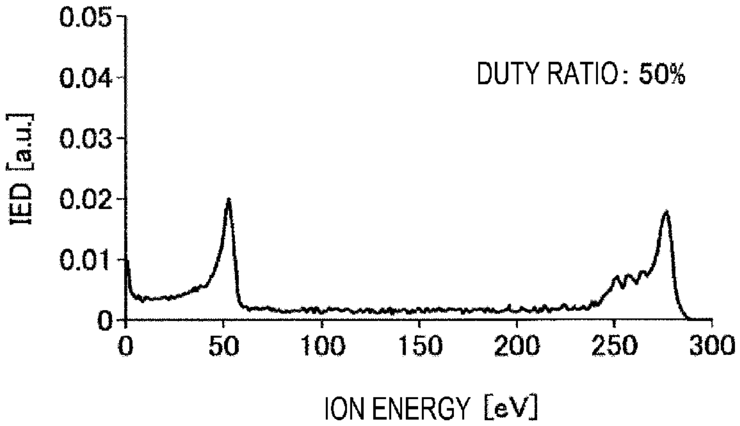
FIG. 19D illustrates a simulation result representing an exemplary relationship between a duty ratio and energy of ions radiated to a substrate.
Figure 19E:
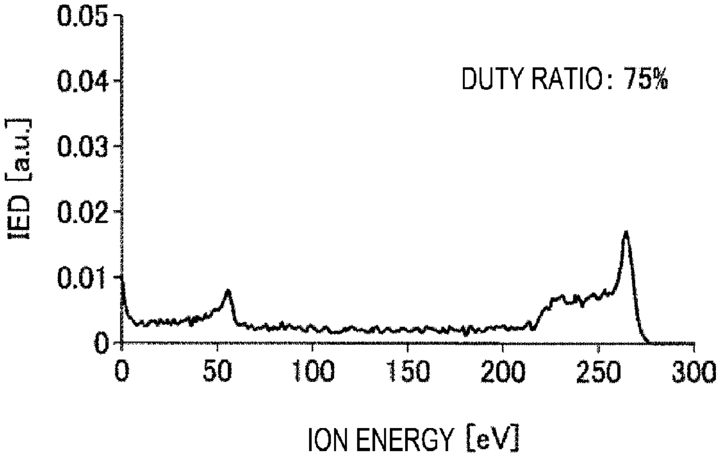
FIG. 19E illustrates a simulation result representing an exemplary relationship between a duty ratio and energy of ions radiated to a substrate.
Figure 20A:
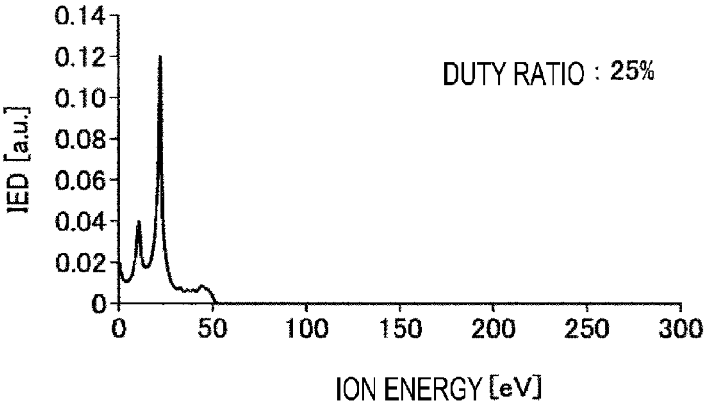
FIG. 20A illustrates a simulation result representing an exemplary relationship between a duty ratio and energy of ions radiated to the inner wall of the chamber body.
Figure 20B:
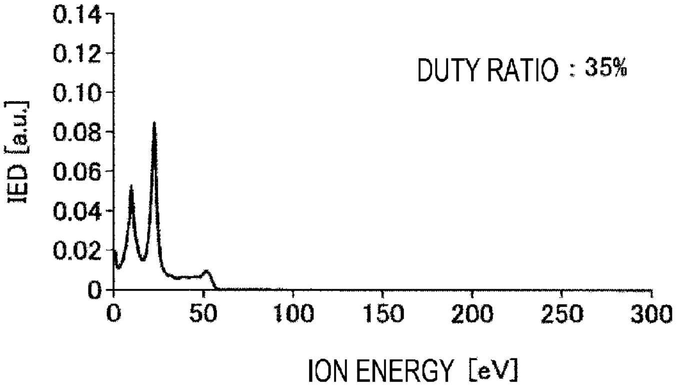
FIG. 20B illustrates a simulation result representing an exemplary relationship between a duty ratio and energy of ions radiated to the inner wall of the chamber body.
Figure 20C:
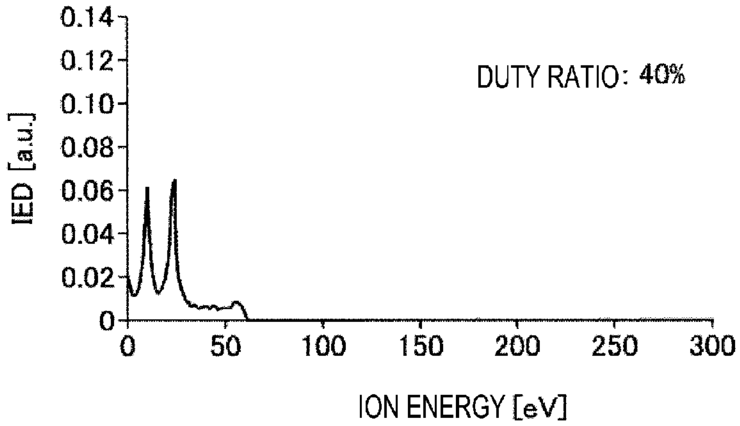
FIG. 20C illustrates a simulation result representing an exemplary relationship between a duty ratio and energy of ions radiated to the inner wall of the chamber body.
Figure 20D:
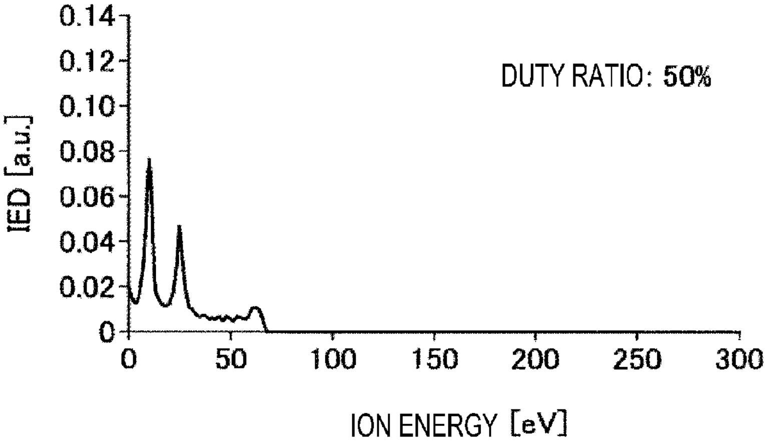
FIG. 20D illustrates a simulation result representing an exemplary relationship between a duty ratio and energy of ions radiated to the inner wall of the chamber body.
Figure 20E:
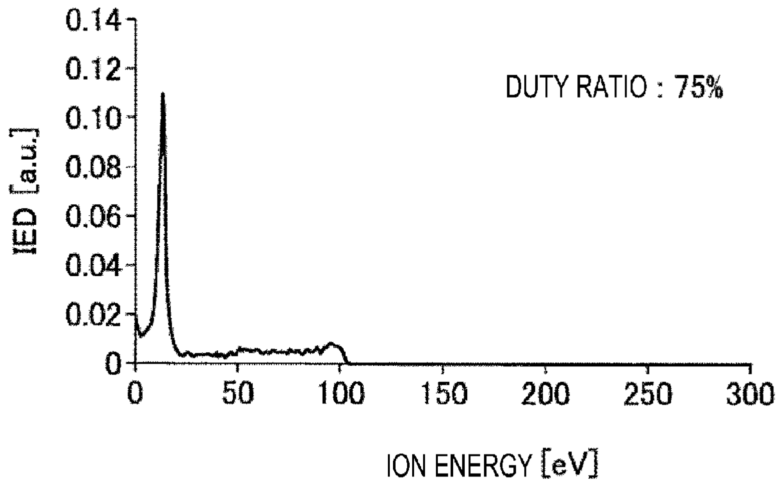
FIG. 20E illustrates a simulation result representing an exemplary relationship between a duty ratio and energy of ions radiated to the inner wall of the chamber body.

Pressure of chamber 12*c*: 20 mTorr (2.66 Pa)
Flow rate of gas supplied to chamber 12*c*
- $C_4F_8$ gas: 24 sccm
- $O_2$ gas: 16 sccm
- Ar gas: 150 sccm First radio-frequency wave: 100 MHz, continuous waves of 500 W
Second radio-frequency wave: 400 MHz, continuous waves of 2500 W
Processing time: 60 sec In each of the second evaluation test and the comparative test, the etching amount (the reduction amount in film thickness) of the silicon oxide film on the sample attached to the chamber 12 side surface of the top plate 34 was measured. In each of the second evaluation test and the comparative test, the etching amount (the reduction amount in film thickness) of the silicon oxide film of the sample attached to the side wall of the chamber body 12 was measured. FIG. 18A illustrates graphs each representing the relationship between the duty ratio and the etching amount of the silicon oxide film on the sample attached to the chamber 12*c* side surface of the top plate 34, in which the duty ratio and the etching amount were obtained in each of the second evaluation test and the comparative test. FIG. 18B illustrates graphs each representing the relationship between the duty ratio and the etching amount of the silicon oxide film on the sample attached to the side wall of the chamber body 12, in which the duty ratio and the etching amount were obtained in each of the second evaluation test and the comparative text. In the graphs of FIG. 18A, the horizontal axis represents a radial distance of a measurement position in each sample attached to the chamber 12*c* side surface of the top plate 34 from the center of the chamber 12*c*. In addition, in the graphs of FIG. 18A, the vertical axis represents the etching amount of the silicon oxide film of each sample attached to the chamber 12*c* side surface of the top plate 34. In the graphs of FIG. 18B, the horizontal axis represents a vertical distance of a measurement position in each sample attached to the side wall of the chamber 12*c* from the chamber 12*c* side surface of the top plate 34. Further, in the graphs of FIG. 18B, the vertical axis represents the etching amount of the silicon oxide film of each sample attached to the side wall of the chamber body 12.

As illustrated in FIGS. 18A and 18B, compared to that in the comparative test using the second radio-frequency waves, in the second evaluation test using the negative DC voltage, the etching amount of the silicon oxide film of the sample attached to the chamber 12*c* side surface of the top plate 34 was small. In addition, as illustrated in FIGS. 18A and 18B, compared to that in the comparative test using the second radio-frequency waves, in the second evaluation test using the negative DC voltage, the etching amount of the silicon oxide film of the sample attached to the side wall of the chamber body 12 was considerably small. Therefore, by cyclically applying the negative DC voltage to the lower electrode 18, the following effects were confirmed. That is, it was confirmed that it is possible to largely reduce the energy of ions radiated to the wall surface of the chamber body 12 and the wall surface of the upper electrode 30 while suppressing the decrease of the energy of ions radiated to a substrate on the electrostatic chuck 20.

Hereinafter, an evaluation simulation performed on a plasma processing method using the plasma processing apparatus 10 will be described.

(Evaluation Simulation)

In the evaluation simulation, the energy distribution of ions (IED) radiated to a substrate W and the energy distribution of ions (IED) radiated to the inner wall of the chamber body 12 were simulated under the following conditions. Meanwhile, in the evaluation simulation, the duty ratio of the negative DC voltage cyclically applied to the lower electrode 18 was used as a variable parameter in the state in which the DC frequency was set to 200 kHz lower than 1 MHz.

<Conditions of Evaluation Simulation>

Pressure of chamber 12*c*: 30 mTorr (4.00 Pa)

Flow rate of gas supplied to chamber 12*c*: Ar gas

First radio-frequency wave: 100 MHz, continuous waves of 500 W

Negative DC voltage with respect to lower electrode 18

Voltage value: −450 V

Frequency (DC frequency): 200 kHz

FIGS. 19A to 19E illustrate simulation results each representing an exemplary relationship between a duty ratio and energy of ions radiated to a substrate. FIGS. 20A to 20E illustrate simulation results each representing an exemplary relationship between a duty ratio and energy of ions radiated to the inner wall of the chamber body.

As illustrated in FIGS. 19A to 19E, the maximum value of the energy of ions radiated to a substrate W was maintained at about 270 eV, which is within a predetermined allowable specification range, regardless of the change of the duty ratio. In addition, as illustrated in FIGS. 20A to 20E, when the duty ratio is 50% or less, the maximum value of the energy of ions radiated to the inner wall of the chamber body 12 was reduced to 60 eV or less, which is within the predetermined allowable specification range. Therefore, in the evaluation simulation, it was confirmed that the dependency of the etching rate of the substrate W on the duty ratio of the DC voltage was relatively small when the DC frequency was set to 200 kHz less than 1 MHz. In addition, it was confirmed that when the duty ratio is regulated to 50% or less in the state in which the DC frequency was set to 200 kHz less than 1 MHz, the energy of ions radiated to the inner wall of the chamber body 12 was reduced to the predetermined allowable specification range.

According to the present disclosure, it is possible to suppress the etching rate of a substrate from being deteriorated and to lower the energy of ions radiated to the inner wall of a chamber body.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:

a chamber body configured to provide a chamber therein;

a stage installed in the chamber body and including a lower electrode, the stage being configured to support a substrate;

a first radio-frequency power supply configured to supply first radio-frequency waves for exciting a gas supplied to the chamber;

a second radio-frequency power supply configured to generate second radio-frequency waves supplied to the lower electrode;

at least one DC power supply configured to generate a negative DC voltage applied to the lower electrode;

a switch configured to switch between application of the negative DC voltage to the lower electrode and stop of the application; and a controller configured to:

control the switch, such that either the second radio-frequency waves or the negative DC voltage is selectively supplied to the lower electrode to draw ions into the substrate such that the second radio-frequency waves are not supplied to the lower electrode throughout an entire period during which the negative DC voltage is supplied, control the switch such that only the negative DC voltage from the at least one DC power supply is cyclically applied to the lower electrode in a period during which the first radio-frequency waves are supplied, control the first radio-frequency power supply to cyclically supply the first radio-frequency waves such that the negative DC voltage is applied during periods when supply of the first radio-frequency waves is stopped, and application of the negative DC voltage is stopped during periods when the first radio-frequency waves are supplied, and in a state where a frequency defining each cycle in which the negative DC voltage is applied to the lower electrode ranges from 200 kHz to 800 kHz, regulate a ratio of time during which the negative DC voltage is applied to the lower electrode to a total time of each cycle, the total time of each cycle including both the time during which the negative DC voltage is applied and time during which the negative DC voltage is not applied to the lower electrode.

2. The plasma processing apparatus according to claim 1, wherein in the applying of only the negative DC voltage, the controller is configured to control the switch such that energy of ions radiated to an inner wall of the chamber body is reduced by regulating the ratio.

3. The plasma processing apparatus according to claim 2, wherein the controller is configured to control the switch such that the ratio is regulated to 50% or less, the plasma processing apparatus includes a plurality of DC power supplies as the at least one DC power supply, and the controller is configured to control the switch such that the negative DC voltage applied to the lower electrode in the each cycle is formed by a plurality of DC voltages sequentially output from the plurality of DC power supplies.

4. The plasma processing apparatus according to claim 3, wherein the first radio-frequency waves have a frequency within a range of 27 MHz to 100 MHz.

5. The plasma processing apparatus according to claim 2, wherein the controller is configured to control the switch such that the ratio is regulated to 50% or less.

6. The plasma processing apparatus according to claim 1, wherein the plasma processing apparatus includes a plurality of DC power supplies as the at least one DC power supply, and the controller is configured to control the switch such that the negative DC voltage applied to the lower electrode in the each cycle is formed by a plurality of DC voltages sequentially output from the plurality of DC power supplies.

7. The plasma processing apparatus according to claim 1, wherein the controller is configured to control the switch such that the first radio-frequency waves are cyclically supplied with a duty ratio regulated to 50% or less.

8. The plasma processing apparatus according to claim 1, wherein the controller is configured to regulate the ratio occupied by the period during which the negative DC voltage is applied to the lower electrode in the each cycle to 35% or less, and control the switch such that the first radio-frequency waves are cyclically supplied with a duty ratio regulated to 35% or less.

* * * * *